United States Patent
Mukaiyama et al.

(10) Patent No.: US 7,518,472 B2
(45) Date of Patent: Apr. 14, 2009

(54) TRANSMISSION LINE CONNECTING STRUCTURE AND TRANSMISSION/RECEPTION DEVICE

(75) Inventors: Kazutaka Mukaiyama, Sagamihara (JP); Shigeyuki Mikami, Sagamihara (JP); Yohei Ishikawa, Yokohama (JP)

(73) Assignee: Murata Manufacturing Co., Ltd. (JP)

( * ) Notice: Subject to any disclaimer, the term of this patent is extended or adjusted under 35 U.S.C. 154(b) by 310 days.

(21) Appl. No.: 10/589,626

(22) PCT Filed: Jul. 25, 2005

(86) PCT No.: PCT/JP2005/013555

§ 371 (c)(1),
(2), (4) Date: Aug. 16, 2006

(87) PCT Pub. No.: WO2006/022104

PCT Pub. Date: Mar. 2, 2006

(65) Prior Publication Data

US 2007/0176713 A1 Aug. 2, 2007

(30) Foreign Application Priority Data

Aug. 24, 2004 (JP) ............................. 2004-244016

(51) Int. Cl.
*H01P 5/12* (2006.01)
*H01P 1/20* (2006.01)

(52) U.S. Cl. .................... 333/202; 333/24 R; 333/204; 333/219

(58) Field of Classification Search ............... 333/24 R, 333/202, 204, 208, 219, 219.1, 238, 246, 333/254, 260

See application file for complete search history.

(56) References Cited

U.S. PATENT DOCUMENTS

| | | | | |
|---|---|---|---|---|
| 3,451,015 | A * | 6/1969 | Heath | 333/203 |
| 5,750,473 | A * | 5/1998 | Shen | 505/210 |
| 6,489,865 | B1 * | 12/2002 | Tsujiguchi et al. | 333/204 |
| 6,538,526 | B2 * | 3/2003 | Mikami et al. | 333/24 R |
| 6,943,651 | B2 * | 9/2005 | Mukaiyama et al. | 333/219.1 |
| 7,245,195 | B2 * | 7/2007 | Satoh et al. | 333/204 |
| 7,274,273 | B2 * | 9/2007 | Hirose et al. | 333/134 |
| 7,378,924 | B2 * | 5/2008 | Koizumi et al. | 333/204 |

FOREIGN PATENT DOCUMENTS

| | | |
|---|---|---|
| EP | 0821427 | 1/1998 |
| EP | 1148572 | 10/2001 |
| GB | 2168542 | 6/1986 |
| JP | S63-59101 | 3/1988 |

(Continued)

OTHER PUBLICATIONS

International Search Report for PCT/JP2005/013555 dated Oct. 25, 2005.
Written Opinion PCT/JP2005/013555 dated Oct. 25, 2005.

*Primary Examiner*—Benny Lee
*Assistant Examiner*—Kimberly E Glenn
(74) *Attorney, Agent, or Firm*—Dickstein, Shapiro, LLP.

(57) ABSTRACT

A transmission line having a slot line with a slot formed on a front surface electrode on a dielectric substrate, and two such slot lines are positioned with the front surface electrodes separated from one another with a gap therebetween. A slot resonator with one end open at the gap side is provided at the front edge side of each slot line, and these slot resonators are positioned so as to be capable of coupling to one another. A slot stub which is branched out from the gap side is provided on each front surface electrode. Thus, leakage of a high-frequency signal in the gap can be suppressed with the slot stub.

20 Claims, 22 Drawing Sheets

FOREIGN PATENT DOCUMENTS

| | | |
|---|---|---|
| JP | 10-13105 | 1/1998 |
| JP | 10-256801 | 9/1998 |
| JP | 3045074 | 3/2000 |
| JP | 2001 308601 | 11/2001 |
| JP | 2003-101301 | 4/2003 |
| JP | 2003-309405 | 10/2003 |

* cited by examiner

US 7,518,472 B2

TRANSMISSION LINE CONNECTING STRUCTURE AND TRANSMISSION/RECEPTION DEVICE

FIELD OF THE INVENTION

The present invention relates to a transmission line connecting structure for transmitting high-frequency signals such as microwaves or millimeter waves for example, and a transmission/reception device which is configured using the transmission line connecting structure.

BACKGROUND OF THE INVENTION

In general, a conventional transmission line connecting structure is known wherein a slot line is configured by forming a slot of a predetermined slot width dividing a front surface electrode formed on the front surface of a dielectric substrate, for example, and multiple such slot lines are connected to each other (e.g., see Patent Document 1). With such conventional art, the front face electrodes of two slot lines are positioned in a state opposing one another across a predetermined gap provided therebetween, and also provided to each front surface electrode is a slot resonator with one end open which is made of a generally square notch wherein the edge on the gap side is open. The slot lines are each connected to each slot resonator, and also these two slot resonators are coupled one to another, with the two slot lines being connected so as to be capable of propagating high-frequency signals. Also, a configuration of a transmission/reception device is known, such as a communication device using such a transmission line connecting structure (e.g., see Patent Document 2).

Patent Document 1: Japanese Unexamined Patent Application Publication No. 2001-308601

Patent Document 2: Japanese Unexamined Patent Application Publication No. 2003-101301

With the conventional art in Patent Document 1, one end of the slot resonators are open towards the gap between the two front surface electrodes, and so the high-frequency signal can leak from the open edge sides of the slot resonators towards the gap. When a transmission/reception device using a transmission line is housed within a package as described in Patent Document 2, in general the front surface electrode is in contact with a conducting wall face in the package and is grounded for example. Accordingly, the front end of the gap is short-circuited by the wall face within the package. In other words, the gap between the front surface electrodes function as a leakage line, and also the front edge of this leakage line is short-circuited by the package. Thus, the actual current from the leaked high-frequency signal flows at the short edge (short-circuit edge) of the leakage line in the package, and so the resonance frequency of the slot resonator can easily be influenced by the connection state of the front surface electrode and the package. As a result, a problem can occur wherein the coupling properties of the two slot lines become unstable.

Also, the resonance frequency of the slot resonators changes based on the distance from the slot resonator to the package. Thus, in order to maintain the coupling properties between the slot lines constant, the measurement precision of the parts of the dielectric substrate, the front surface electrode, and the package and the like, and the mounting precision when mounting the dielectric substrate within the package, needs to be improved. Thus, a problem can occur wherein the manufacturing cost for configuring a module such as a communication device increases.

Further, the resonance frequency of the slot resonators changes according to the distance measurements of the leakage line between the package and the slot resonator, and so the connecting structure of the package and the front surface electrode needs to be designed for each measurement of the package. Thus, there is the problem of low design freedom.

SUMMARY OF THE INVENTION

The present invention has been made in light of the problems of the conventional art described above, and accordingly it is an object thereof to provide a transmission line connecting structure and a transmission/reception device which suppresses propagation of a leaked current through the gaps between the electrodes of the transmission lines, stabilizes the coupling properties between the transmission lines, and lowers the manufacturing cost and improves the degree of design freedom.

In order to solve the above-described problems, the present invention is a transmission line connecting structure comprising: a transmission line including a dielectric substrate, an electrode formed on one side of the dielectric substrate, and a slot having a predetermined width and formed at the electrode, a plurality of such transmission lines being connected; wherein an electrode of one of the plurality of transmission lines and an electrode of another one of the plurality of transmission lines are provided at a distance from one another with a gap therebetween; and wherein a resonator is connected to said transmission line, one end of the resonator is open on the gap side, the resonator is provided at each electrode so as to be able to couple with one another; and wherein a stub for suppressing leakage of a signal in the gap between the plurality of electrodes is provided at at least one of said plurality of electrodes; and wherein, when the wavelength of a high-frequency signal in odd mode which propagates said transmission line is $\lambda g\_odd$, the length of the stub is set to the approximate value of $\lambda g\_odd/4$, and the length between said resonator and stub is set to a value sufficiently smaller than $\lambda g\_odd/2$.

According to the present invention, the multiple electrodes which are separated with a gap therebetween each have a resonator provided thereupon, and a transmission line is connected to each resonator. Thus, by coupling multiple resonators to one another, multiple transmission lines can be connected, and the high-frequency signal can propagate between these transmission lines. At this time, the resonator is open on the gap side, and so the high-frequency signal has a tendency to leak in the gap between the electrodes from the open end of the resonator. Conversely, by providing a stub on at least one of the electrodes of the multiple electrodes, leakage of the high-frequency signal in the gap can be suppressed by using the stub. Thus, even when the front edge side of the gap is short-circuited by the package internal wall or the like for example, actual current from the high-frequency signal does not flow to this short-circuit edge, and the resonance frequency of the resonator can be stabilized. As a result, the connection state of the transmission line can be stabilized, and also the measurement precision or mounting precision of the dielectric substrate, electrodes, and so forth do not need to be improved, and the cost can be lowered and the degree of design freedom can be improved.

Also, the length of the stub is set to the approximate value of the wavelength $\lambda g\_odd/4$ of the high-frequency signal in odd mode. Therefore, even when the high-frequency signal in odd mode leaks through the gaps, the branching position (base end side of the stub) of the gap and the stub can be made into a virtual open end as to the high-frequency signal. Thus, the reflective properties as to the leaked high-frequency signal improves, and so the leaked high-frequency signal can be blocked with the stub in a sure manner, and the stability of the resonance frequency of the resonator can be further increased. As a result, even when there is comparatively large inconsistencies in the various measurements of the dielectric substrate and so forth, a desired transiting band can be secured between the two transmission lines, and also connection loss of the two transmission lines can be reduced.

Further, the length between the resonator and the stub is set to a value sufficiently smaller than ½ of the wavelength $\lambda g\_odd$ of the high-frequency signal in odd mode. Therefore, when the two resonators are resonating in odd mode in which an electrical field is formed mutually in the opposite direction, the two resonators resonate at a resonating frequency of an approximate value of $\lambda g\_odd/2$, which is the sum of the length of the resonator, the length between the resonator and the stub, and the length of the stub.

Now, in order to have the two resonators also resonate in even mode in which an electrical field is formed mutually in the same direction, the length of the resonator extended along the propagating direction of the high-frequency signal should be set to a value around ¼ of the wavelength $\lambda g\_even$ of the high-frequency signal in even mode. Also, when the two resonators resonate in even mode, the high-frequency signal does not leak into the gaps. Therefore, the resonating frequency in the even mode is a generally fixed value, regardless of the length between the resonator and the stub. On the other hand, the resonating frequency in the odd mode varies with the length between the resonator and stub and the length of the stub. Thus, the resonating frequency in the odd mode can be set by the length between the resonator and stub and so forth. As a result, a bandpass filter with two stages can be configured by using the coupling between the even mode and the odd mode, and also the resonating frequency in the odd mode can be set independently from the resonating frequency in the even mode, and the design of the connecting structure can be improved.

Also, the length between the resonator and the stub is set to a value sufficiently smaller than $\lambda g\_odd/2$. Therefore, the resonating frequency in the odd mode can be set lower than the resonating frequency in the even mode, and a pass band can be provided on the lower side of the resonating frequency in the even mode. Further, because the length between the resonator and the stub is set to a value sufficiently smaller than $\lambda g\_odd/2$, the resonator and the stub can be positioned in close proximity, and the connecting structure of the transmission line can be downscaled.

Also, the present invention can be configured such that a transmission line connecting structure comprises: a transmission line including a dielectric substrate, an electrode formed on each side of the dielectric substrate, and a slot having a predetermined width, each slot opposing one another while sandwiching said dielectric substrate, the slot being formed at each electrode, a plurality of such transmission lines being connected; wherein an electrode of one of the plurality of transmission lines and an electrode of another one of the plurality of transmission lines are provided at a distance from one another with a gap therebetween; and wherein a resonator is connected to said transmission line, one end of the resonator is open on the gap side, the resonator is provided at each electrode so as to be able to couple with one another; and wherein a stub for suppressing leakage of a signal in the gap between the plurality of electrodes is provided at at least one of said plurality of electrodes; and wherein, when the wavelength of a high-frequency signal in odd mode which propagates said transmission line is $\lambda g\_odd$, the length of the stub is set to the approximate value of $\lambda g\_odd/4$, and the length between said resonator and stub is set to a value sufficiently smaller than $\lambda g\_odd/2$.

This case differs from the above description wherein an electrode is provided on one side of the dielectric substrate, and here an electrode is provided on each side of the dielectric substrate. However, the point of providing a slot, a resonator, and a stub as to an electrode is the same as with the above-described configuration. Also, the point of setting the length of the stub to an approximate value of $\lambda g\_odd/4$, and setting the length between the resonator and stub is set to a value sufficiently smaller than $\lambda g\_odd/2$ is also the same as with the above-described configuration. Accordingly, even in the case that an electrode is provided on each side of the dielectric substrate, generally the same effects can be obtained as with the case of providing an electrode on one side of the dielectric substrate, as described above.

Also, the present invention can be configured such that a transmission line connecting structure comprises: a transmission line including a dielectric substrate, an electrode formed on one side of the dielectric substrate, and a slot having a predetermined width and formed at the electrode, a plurality of such transmission lines being connected; wherein an electrode of one of the plurality of transmission lines and an electrode of another one of the plurality of transmission lines are provided at a distance from one another with a gap therebetween; and wherein a resonator is connected to said transmission line, one end of the resonator is open on the gap side, the resonator is provided at each electrode so as to be able to couple with one another; and wherein a stub for suppressing leakage of a signal in the gap between the plurality of electrodes is provided at at least one of said plurality of electrodes; and wherein when the wavelength of a high-frequency signal in odd mode which propagates said transmission line is $\lambda g\_odd$, the length of the stub is set to the approximate value of $\lambda g\_odd/4$, and the length between said resonator and stub is set to the approximate value of $\lambda g\_odd/2$.

In this case also, a stub is provided on at least one of the electrodes. Therefore, leakage of the high-frequency signal in the gaps can be suppressed using this stub. Also, the length of the stub is set to the approximate value of $\lambda g\_odd/4$. Therefore, even when the high-frequency signal in odd mode leaks through the gaps, the branching position (base end side of the stub) of the gap and the stub can be made into a virtual open end as to the high-frequency signal. Thus, the reflective properties of the leaked high-frequency signal improves, and so the leaked high-frequency signal can be blocked with the stub in a sure manner, and the stability of the resonance frequency of the resonator can be further heightened. As a result, even when there is comparatively large inconsistencies in the various measurements of the dielectric substrate and so forth, a desired pass band can be secured between the two transmission lines, and also connection loss of the two transmission can be reduced.

Further, the length between the resonator and the stub is set to a value around ½ of the wavelength $\lambda g\_odd$ of the high-frequency signal in odd mode. Therefore, when the two resonators are resonating in odd mode in which an electrical field is formed mutually in the opposite direction, the two resonators resonate at a resonating frequency of an approximate value of the wavelength $\lambda g\_odd$, which is the sum of the length of the resonator, the length between the resonator and the stub, and the length of the stub.

Now, in order to have the two resonators also resonate in even mode in which an electrical field is formed mutually in the same direction, the length of the resonator extended along the propagating direction of the high-frequency signal should be set to a value around ¼ of the wavelength λg_even of the high-frequency signal in even mode. Also, when the two resonators resonate in even mode, the high-frequency signal does not leak into the gaps, and so the resonating frequency in the even mode is a generally fixed value, regardless of the length between the resonators and the stubs. On the other hand, the resonating frequency in the odd mode varies with the length between the resonator and stub and the length of the stub. Thus, the resonating frequency in odd mode can be set by the length between the resonator and stubs and so fort. As a result, a bandpass filter with two stages can be configured by using the coupling between the even mode and the odd mode, and also the resonating frequency in the odd mode can be set independently from the resonating frequency in the even mode, and the design of the connecting structure can be improved.

Also, the length between the resonator and the stub is set to an approximate value of λg_odd/2, and so the resonating frequency in the odd mode can be set higher than the resonating frequency in the even mode, and a pass band can be provided on the higher side of the resonating frequency in the even mode.

Also, the present invention can be configured such that a transmission line connecting structure comprises: a transmission line including a dielectric substrate, an electrode formed on each side of the dielectric substrate, and a slot having a predetermined width, each slot opposing one another while sandwiching said dielectric substrate, the slot being formed at each electrode, a plurality of such transmission lines being connected; wherein an electrode of one of the plurality of transmission lines and an electrode of another one of the plurality of transmission lines are provided at a distance from one another with a gap therebetween; and wherein a resonator is connected to said transmission line, one end of the resonator is open on the gap side, the resonator is provided at each electrode so as to be able to couple with one another; and wherein a stub for suppressing leakage of a signal in the gap between the plurality of electrodes is provided at at least one of said plurality of electrodes; and wherein, when the wavelength of a high-frequency signal in odd mode which propagates said transmission line is λg_odd, the length of the stub is set to the approximate value of λg_odd/4, and the length between said resonator and stub is set to the approximate value of λg_odd/2.

In this case also, the length between the resonator and the stub is set to the approximate value of λg_odd/2, and so generally the same effects can be obtained as with the above description.

Further, a transmission/reception device such as a communication device, a radar device or the like can be configured using the transmission line connecting structure according to the present invention.

With such a configuration, even when multiple transmission lines are positioned within a device, these transmission lines can be connected using the resonators. Also, even when there are gaps formed between the electrodes of the multiple transmission lines, propagation of the leaked high-frequency signals into the gaps can be suppressed with the stubs provided on the electrodes. Therefore, the connection state of the transmission lines can be stabilized, and so the properties of the entire transmission/reception device can be stabilized, and reliability can be improved. Further, the connection properties of the transmission lines can be stabilized regardless of the measurement precision or mounting precision of the dielectric substrate, electrodes, package and so forth, and so the manufacturing cost can be lowered and design freedom can be improved for the entire transmission/reception device.

Figure 1:
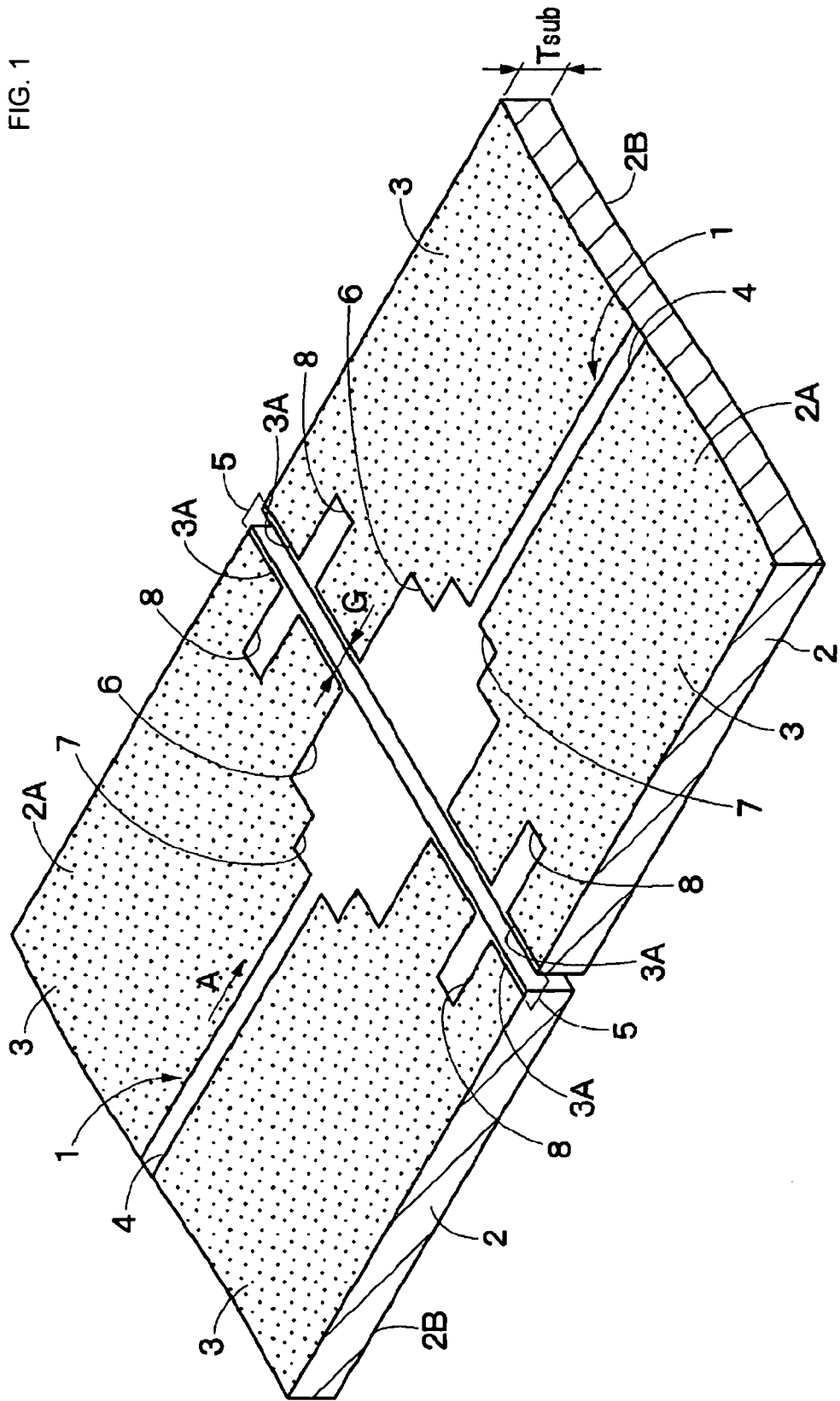
FIG. 1 is a perspective view of a transmission line connecting structure according to a first embodiment.
Figure 2:
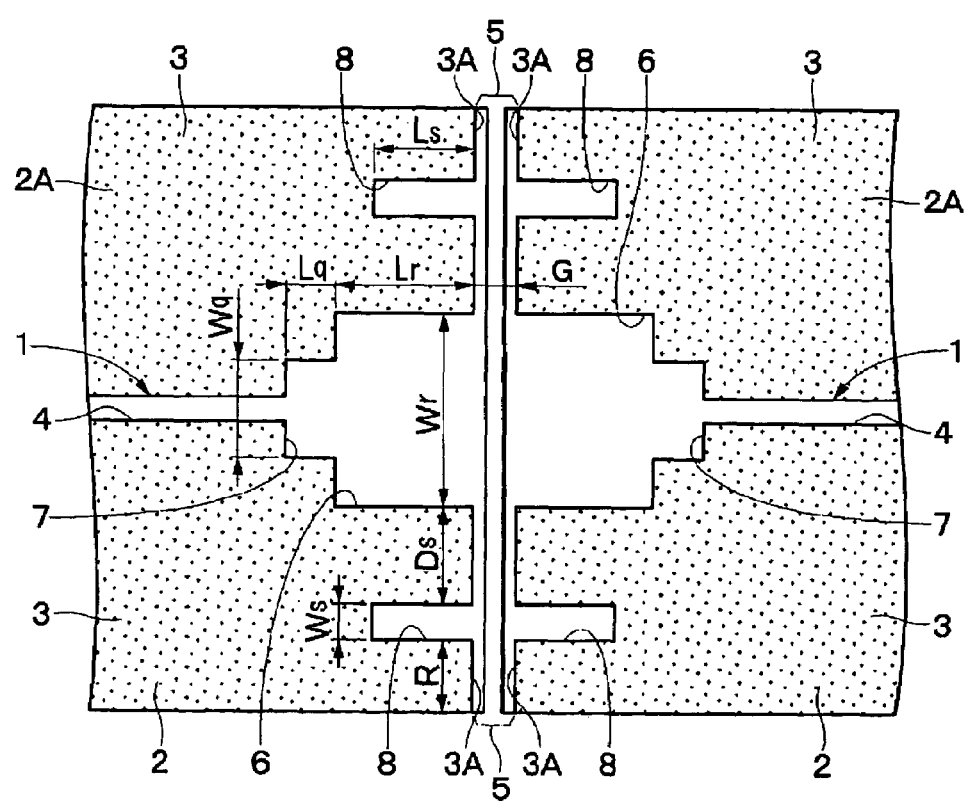
FIG. 2 is an enlarged plan view of the transmission line connecting structure in FIG. 1.

REFERENCE NUMERALS 1 slot line (transmission line)
2, 22 dielectric substrate
2A, 22A front surface
2B, 22B back surface
3 front surface electrode (electrode)
4, 25, 26 slot
5, 27 gap
6 slot resonator (resonator)

7, 29 matching section
8, 11, 12, 13, 14 slot stub (stub)
21 PDTL (transmission line)
23 front surface electrode (double-sided electrode)
24 back surface electrode (double-sided electrode)
28 PDTL resonator (resonator)
30 PDTL stub (stub)

DETAILED DESCRIPTION OF THE INVENTION

A transmission line connecting structure and transmission/reception device according to an embodiment of the present invention will be described below with reference to the attached drawings.

FIG. 1 through FIG. 4 illustrate the transmission line connecting structure according to a first embodiment. In the drawing, 1 denotes a slot line serving as a transmission line. The slot line 1 comprises a dielectric substrate 2, a front surface electrode 3 and a slot 4.

The dielectric substrate 2 is formed in a planar shape with a relative permittivity of ∈r, using a resin material, a ceramics material, or a composite material wherein these are combined and sintered, and has a front surface 2A and a back surface 2B. Also, on the front surface 2A of the dielectric substrate 2, a front surface electrode 3 (an electrode disposed on one side) is provided which is formed as a thin film using, for example, an electroconductive metallic material. Further, on the front surface electrode 3, a slot 4 is formed which is open in a band form (groove) with a fixed width measurement, and this slot 4 extends along the transmission direction of the high-frequency signals such as microwaves or millimeter waves (the arrow A direction in FIG. 1).

Also, two slot lines 1 are positioned linearly for example along the transmission direction of the high-frequency signal. At this time, the dielectric substrates 2 of the two slot lines 1 are positioned separated from one another. Also, with the positions of the two slot lines 1 facing each other, the edge 3A of the front surface electrode 3 is positioned farther to the central side (inner side) than the edge face of the dielectric substrate 2 for example. Thus, the portion of the dielectric substrate 2 protruding towards the other dielectric substrate 2 beyond the edge 3A of the front surface electrode 3A has the front surface 2A of the dielectric substrate 2 exposed.

5 denotes a gap formed between the two front surface electrodes 3 which make up the two slot lines 1. The gap 5 is formed with a fixed spacing measurement of G between the edges 3A of the two front surface electrodes 3, and the two front surface electrodes 3 are separated but opposing one another. Thus, the gap 5 is sandwiched between the two front surface electrodes 3.

6 denotes the slot resonators with one end open which are each provided on the two front surface electrodes 3. Each slot resonator 6 is made of a generally square notch continuous with the slot 4 wherein the edge on the gap side is open, and is each connected to a slot line 1. Here, when the wavelength of the high-frequency signal in even mode which propagates the slot line 1 is $\lambda g\_even$, for example the length Lr along the transmission direction of the high-frequency signal of the slot resonator 6 is set to an approximate value of $\lambda g\_even/4$ ($LR \approx \lambda g\_even/4$). Thus, when the two slot resonators 6 resonate in even mode which has electrical fields E in the same direction with one another, the resonance frequency of the slot resonators 6 is a value corresponding to the wavelength $\lambda g\_even$.

Also, one end side in the length direction of the slot resonator (transmission direction of the high-frequency signal) is positioned on the edge portion side of the front surface electrode 3 (near the edge 3A) and is open towards the gap 5. On the other hand, the other end side in the length direction of the slot resonator 6 is extended toward the central side of the front surface electrode 3, and also the slot line 1 is connected to the central portion in the width direction thereof. Also, the two slot resonators 6 oppose one another with the gap 5 provided therebetween, and also are positioned in close proximity so as to allow direct electromagnetic coupling of both.

Also, in between the slot resonator 6 and the slot line 1 is provided a matching section 7 such that the slot width expands in a stair-step manner. The matching section 7 improves the impedance matching between the slot resonator 6 and the slot line 1, and optimizes the amount of coupling therewith.

8 denotes slot stubs formed on the front surface electrode 3. The slot stubs 8 are formed of slots which extend from the gap 5 toward the central portion side of the front surface electrode 3, and form bands of generally quadrangle shapes branched out from the gap 5. Also, the slot stubs 8 are provided on each of the two front surface electrodes 3 with the gap 5 provided therebetween, and also are provided on both sides in the extension direction of the gap 5 with the slot resonator 6 provided therebetween. Thus, there are two slot stubs 8 on each front surface electrode 3, for a total of four stubs. Also, the length Ls of the slot stub 8 is set to, for example, an approximate value of $\lambda g\_odd/4$ (Ls≈$\lambda g\_odd$) when the wavelength of the high-frequency signal in odd mode which propagates the slot line 1 is $\lambda g\_odd$. Thus, the slot stubs 8 take the midpoint portion of the gap 5 positioned on the base end sides thereof as a virtual open end as to the high-frequency signal in the odd mode.

Also, with the slot stub 8, the distance measurement Ds between the slot resonators 6 is set to a value sufficiently smaller than ½ (Ds<<$\lambda g_{13}$ odd/2) or a value approximately the same value as ½ (Ds≈$\lambda g\_odd/2$), as to the wavelength $\lambda g\_odd$ of the high-frequency wave in odd mode. In other words, the length of the gap 5 positioned between the slot stub 8 and the slot resonator 6 (distance measurement Ds) is appropriately set by spreading the pass frequency band of the two-stage BPF formed from the two slot resonators 6 in the lower side of the resonating frequency in the even mode, or in the higher side thereof.

The transmission line connecting structure according to the present embodiment has the above-described configuration, and the operation thereof will be described below.

When a high-frequency signal is input into one of the slot lines 1, an electrical field E is formed in the width direction of the slot 4, and a magnetic field (not shown) is formed in the length direction of the slot 4 and in the thickness direction of the dielectric substrate 2. The high-frequency signal is propagated along the slot 4 while concentrated in the proximity of the slot 4, and arrives at the slot resonator 6 provided on the edge portion of the slot line 1. At this time, the two slot resonators 6 are positioned so as to be in close proximity to one another, and so the two slot resonators 6 electromagnetically couple with one another. Therefore, the two slot lines 1 are connected to each other using the slot resonator 6, and so the high-frequency signal is propagated from the slot line 1 on one side to the slot line ion the other side, via the two slot resonators 6 which have been electromagnetically coupled.

Thus, the front surface electrodes 3 which make up the slot lines 1 are positioned separate from one another, with the gap 5 provided therebetween at a fixed spacing. Also, two slot resonators 6 are positioned facing each other across the gap 5, with the gap 5 side open. Therefore, the high-frequency signal can leak from the open end of the slot resonator 6 towards the gap 5.

Figure 3:
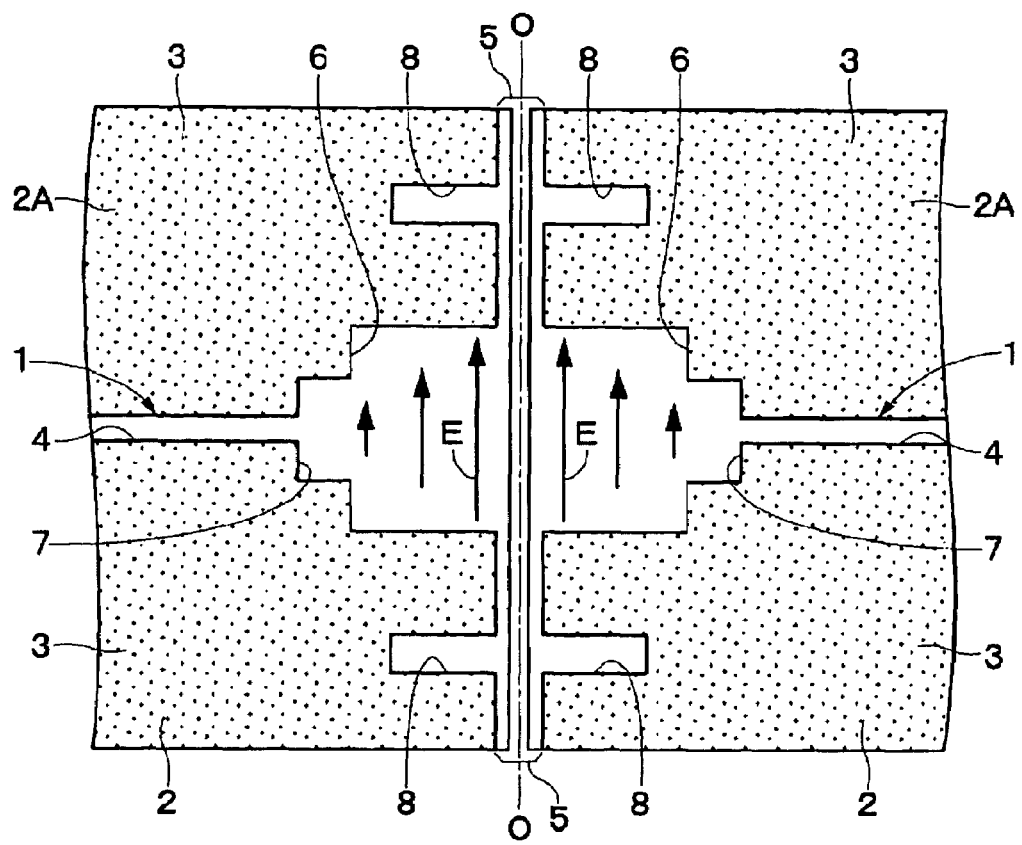
FIG. 3 is a plan view showing a state wherein the slot resonator in FIG. 1 is resonating in even mode.
Figure 4:
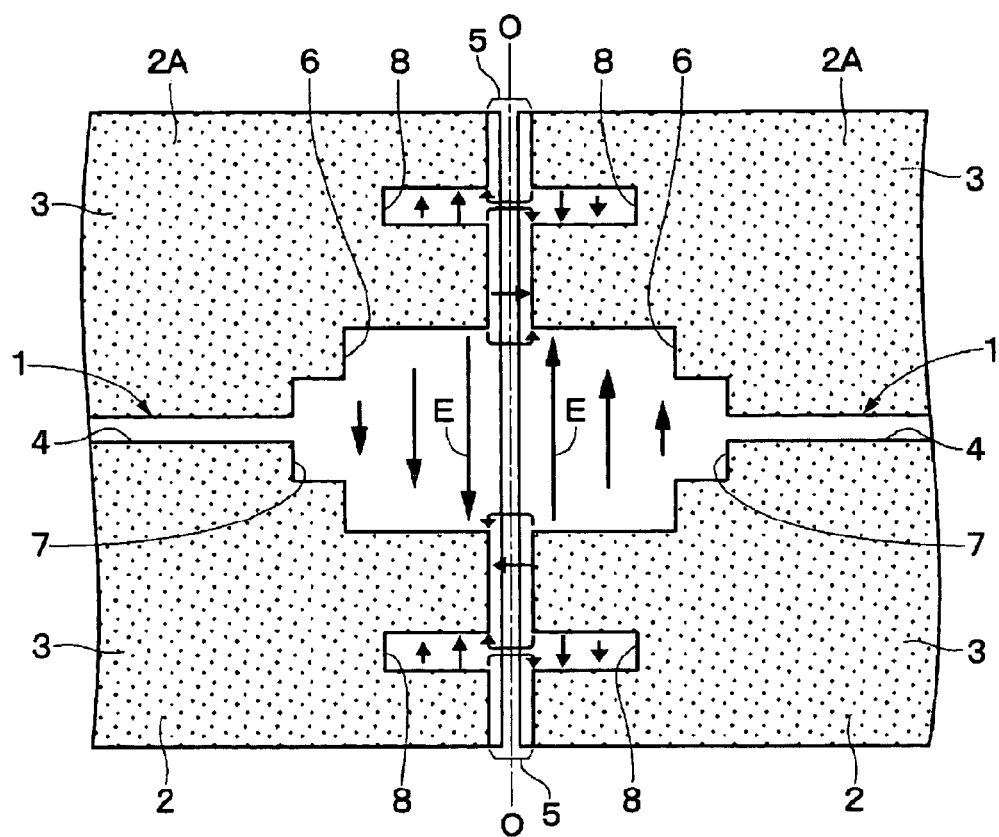
FIG. 4 is a plan view showing a state wherein the slot resonator in FIG. 1 is resonating in odd mode.

As illustrated in FIG. 3, when the two slot resonators 6 both resonate in even mode which has an electrical field E in the same direction as the width direction (the direction orthogonal to the transmission direction), an O-O face positioned between the two front surface electrodes 3 forms a magnetic wall, and thus there is no mode to propagate the gap 5. Conversely, as illustrated in FIG. 4, when the two slot resonators 6 both resonate in odd mode which has an electrical field E in the opposite direction as the width direction, the O-O face forms an electrical wall, and so there is a mode which propagates the gap 5 and leaks from the slot resonator 6 towards both sides of the width direction. Therefore, with the band in the proximity of the resonance frequency in odd mode, a portion of the high-frequency signal propagating the slot line 1 can leak within the gap 5.

On the other hand, the slot lines 1 are generally housed within a package or the like, and the front surface electrodes 3 are in contact with a conducting wall face in the package and for example are connected to a ground, and so the front end of the gap 5 is short-circuited by the wall face within the package. Thus, the actual current from the leaked high-frequency signal within the gap 5 flows to the conducting wall face positioned on the front end of the gap 5. As a result, the resonance frequency of the slot resonators 6 can be easily influenced by the connection state of the front surface electrode 3 and the package, and the coupling properties of the two slot lines 1 have a tendency to become unstable.

Conversely, with the present embodiment, the slot stub 8 is provided which branches out from the gap 5 on the front surface electrode 3, and so leakage of the high-frequency signal transiting the gap 5 can be suppressed by using the slot stub 8. Thus, even when the front end side of the gap 5 is short-circuited by the package inner wall or the like for example, actual current from the high-frequency signal does not flow to the short-circuit end, and the resonance frequency of the slot resonator 6 can be stabilized.

In order to confirm the effects of the present embodiment, the transmission properties of the two slot lines 1 of the present embodiment were calculated with regard to a high-frequency signal of 60 GHz for example, with electromagnetic field simulation. The result thereof is shown in FIG. 5.

The relative permittivity ∈r of the dielectric substrate 2 is set as 24.4 (∈r=24.4), and the thickness measurement of the dielectric substrate 2 Tsub is set as 0.3 mm (Tsub=0.3 mm). Also, for the measurements of the various portions shown in FIG. 1 and FIG. 2, the width Wq of the matching section 7 is 0.2 mm (Wq=0.2 mm), the length Lq of the matching section 7 is 0.225 mm (Lq=0.225 mm), the width Wr of the slot resonator 6 is 0.3 mm (Wr=0.3 mm), the length Lr of the slot resonator 6 is 0.3 mm (Lr=0.3 mm), and the spacing measurement G of the gap 5 is 0.1 mm (G=0.1 mm). Also, the length of the gap 5 between the slot resonator 6 and the slot stub 8 (distance measurement Ds) is 0.3 mm (Ds=0.3 mm), the width Ws of the slot stub 8 is 0.3 mm (Ws=0.3 mm), and also the length Ls of the slot stub 8 is set as 0.33 mm (Ls=0.33 mm) for example, so as to be around ¼ as to the wavelength λg_odd of the high-frequency signal in odd mode. Further, the distance measurement R from the slot stub 8 to the end of the gap 5 is set as 0.5 mm (R=0.5 mm).

Figure 5:
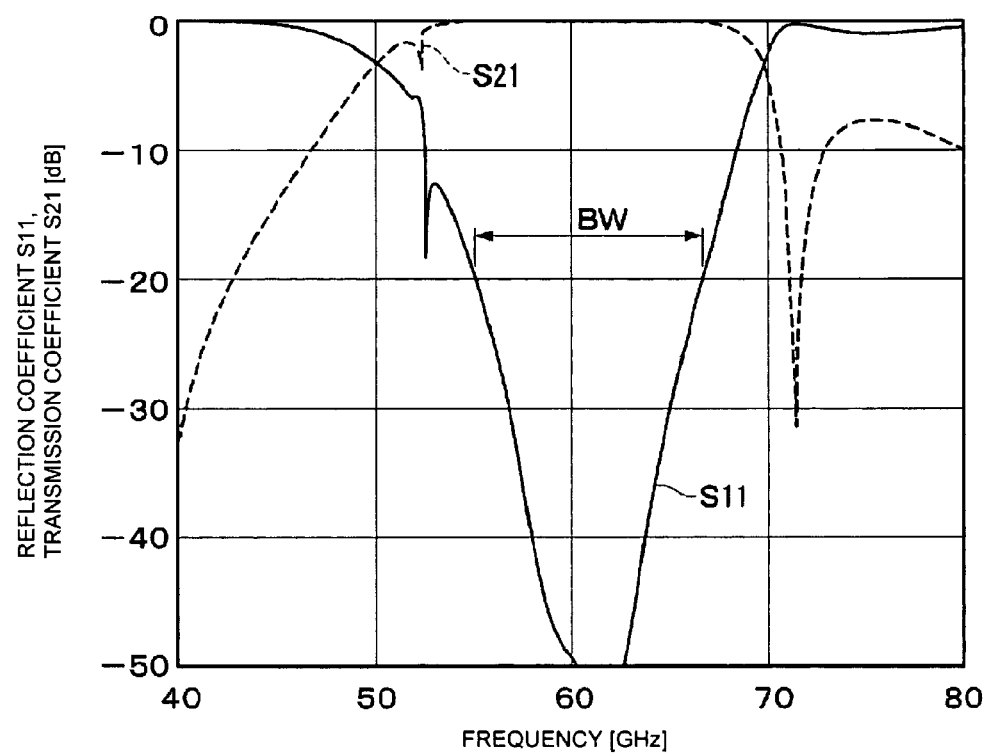
FIG. 5 is a property line diagram showing frequency properties of the reflection coefficient and transmission coefficient of the transmission line connecting structure in FIG. 1.

From the results in FIG. 5, the slot lines 1 are connected using the two slot resonators 6, and so the coupling properties using a two-stage bandpass filter (BPF) in a 60 GHz band are obtained. Here, the pass bandwidth BW wherein the reflection loss RL is 20 dB or less, for example is 10 GHz or more.

Figure 6:
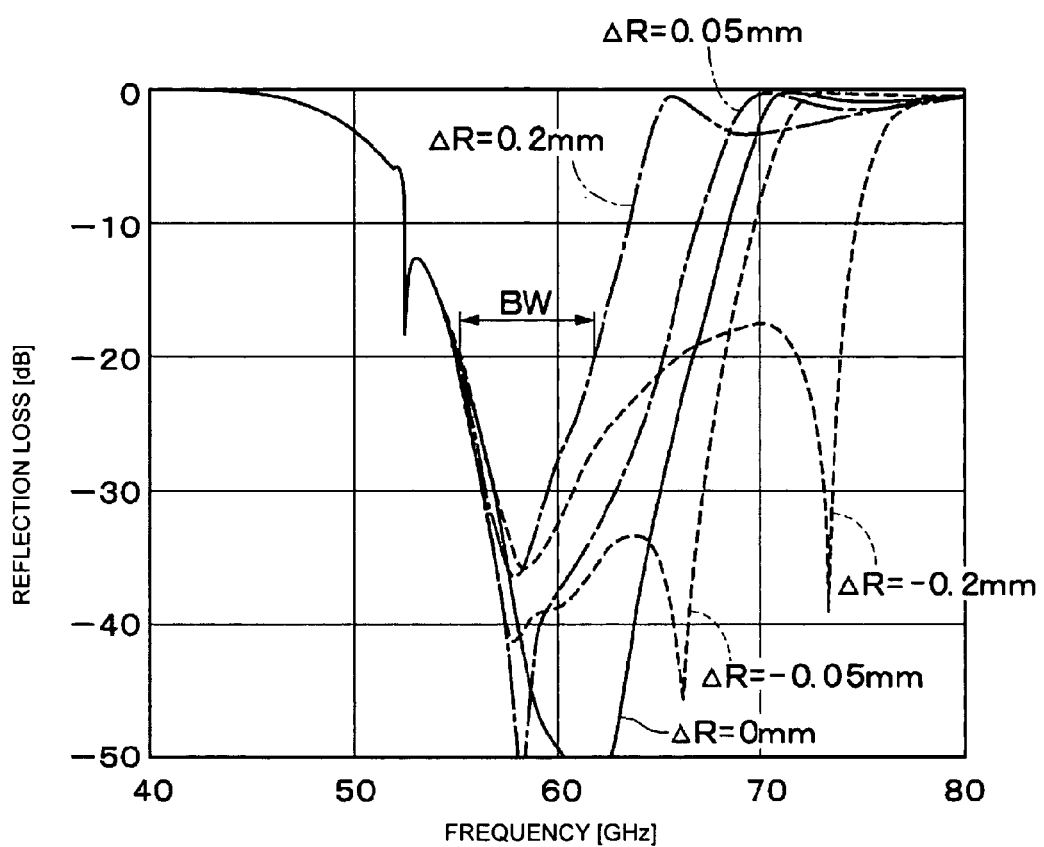
FIG. 6 is a property line diagram showing the results of a simulation of frequency properties of the reflection loss of the transmission line connecting structure in FIG. 1.

The end position of the gap 5 (distance measurement R) as to the connecting structure of the slot lines 1 according to the present embodiment, is varied within the range of ±0.2 mm, and the frequency properties of the reflection loss RL are calculated using a simulation. This result is shown in FIG. 6. The end of the gap 5 is set to be short-circuited.

From the results in FIG. 6, even if the distance measurement R from the slot stub 8 to the end of the gap 5 varies within the range of ±0.2 mm, 6 GHz or higher can be secure for the pass bandwidth BW of which the reflection loss RL is 20 dB or less. Thus, the processing precision of the slot lines 1 is low, and for example even in the case of the dielectric substrate 2 and the front surface electrode 3 and the like generating a measurement error with ±0.2 mm, with the connecting structure of the slot lines 1 according to the present embodiment, it has become apparent that a pass band of approximately 10% as to the 60 GHz which is the frequency of the high-frequency signal can be secured.

Figure 7:
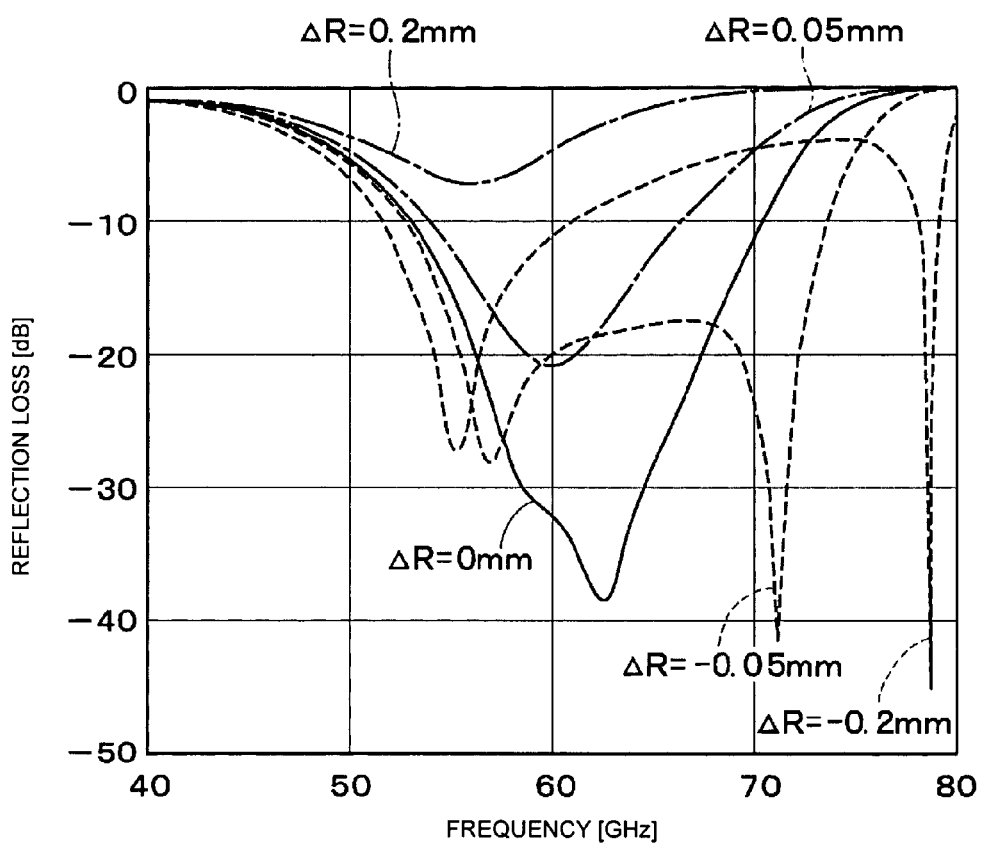
FIG. 7 is a property line diagram showing the results of a simulation of frequency properties of the reflection loss of the transmission line connecting structure in a comparative example.

On the other hand, the frequency properties of the reflection loss RL is calculated using a simulation as with FIG. 6 with regard to the connecting structure of the slot lines 1 with a comparison example wherein the slot stub 8 is omitted. The result thereof is shown in FIG. 7. Note that the end position of the gap 5 varies within the range of ±0.2 mm, and also the end of the gap 5 was short-circuited.

From the results in FIG. 7, when there is no error in the end position of the gap 5 (ΔR=0 mm), coupling properties of a reflection loss RL at 20 dB or less is realized. However, when the end position of the gap 5 is varied ±0.2 mm (ΔR=±0.2 mm), the coupling properties of the reflection loss RL being 20 dB or less cannot be obtained at all. Also, such deterioration of the coupling properties occur in the case wherein the end position of the gap 5 is varied only ±0.05 mm (ΔR=±0.05 mm) for example, and it has become apparent that sufficient coupling properties could not be obtained with the comparison example.

Figure 8:
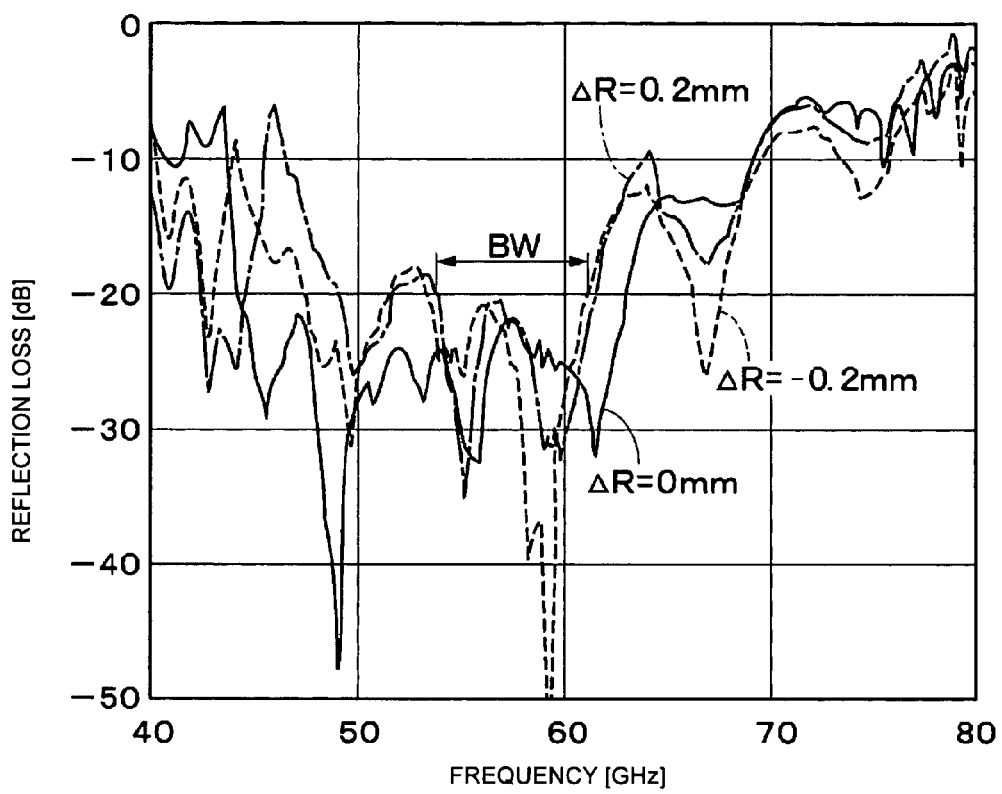
FIG. 8 is a property line diagram showing the results of actual measurements of frequency properties of the reflection loss of the transmission line connecting structure in FIG. 1.

Thus, as an effect of the slot stubs 8, it can be confirmed that sufficient coupling properties can be obtained between the slot lines 1, even with error in the end position of the gap 5. Also, the reflection loss RL was measured for the connecting structure of the slot lines 1 actually created, varying the end position of the gap 5 within the range of ±0.2 mm. The results thereof are shown in FIG. 8. Accordingly the results shown in FIG. 8, even if the end position of the gap 5 with the actual slot line 1 varies within the range of ±0.2 mm, around 5 GHz can be secured for the pass bandwidth BW wherein the reflection loss RL is 20 dB or less.

Figure 11:
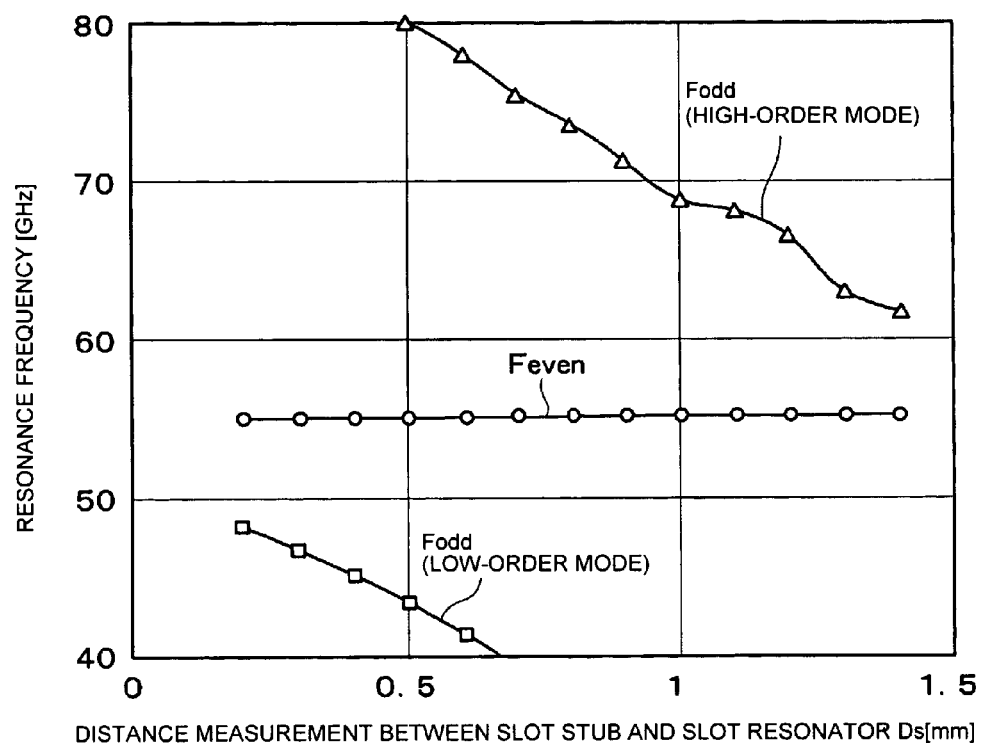
FIG. 11 is a property line diagram showing the resonance frequency corresponding to the distance measurement between the slot stub and the slot resonator.

The relationship of the resonance frequency and the distance measurement Ds between the slot stub 8 and the slot resonator 6 was also studied. The result thereof is shown in FIG. 11. When the wavelength of the high-frequency signal in even mode which propagates the slot line 1 is λg_even, the length Lr of the slot resonator 6 is set to an approximate value of λg_even/4 (Lr=λg_even/4).

Figure 9:
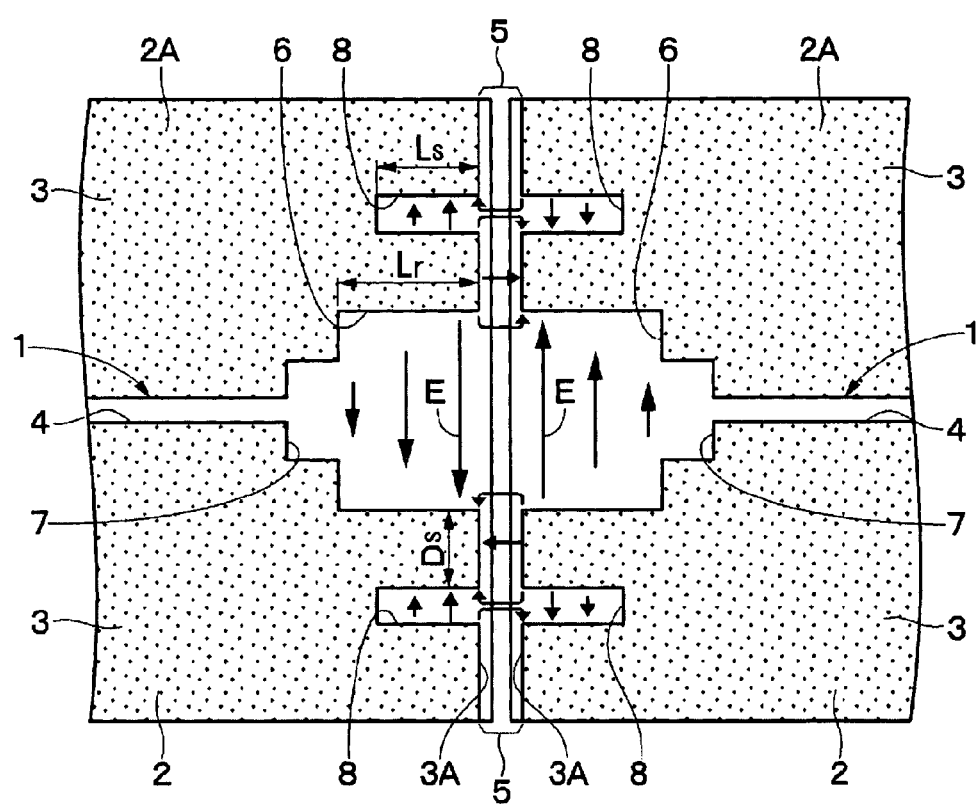
FIG. 9 is a plan view showing a state wherein a slot stub of the transmission line connecting structure according to the first embodiment is positioned in close proximity to a slot resonator.

From the results in FIG. 11, when the distance measurement Ds between the slot stub 8 and the slot resonator 6 is set to a value sufficiently smaller than ½ as to the wavelength λg_odd of the high-frequency signal in odd mode (Ds<<λg_odd/2), the resonance frequency Fodd in odd mode which is even lower than the resonance frequency Feven in even mode becomes a value closer to the resonance frequency Feven in even mode. At this time, the two slot resonators 6 resonate in a state such as that shown in FIG. 9, and the resonance frequency Fodd is a frequency such that the sum of the length Lr of the slot resonator 6, the distance measurement Ds between the slot stub 8 and the slot resonator 6, and the length Ls of the slot stub 8 is approximately ½ of the wavelength λg_odd (Lr+Ds+Ls=λg_odd/2).

Figure 10:
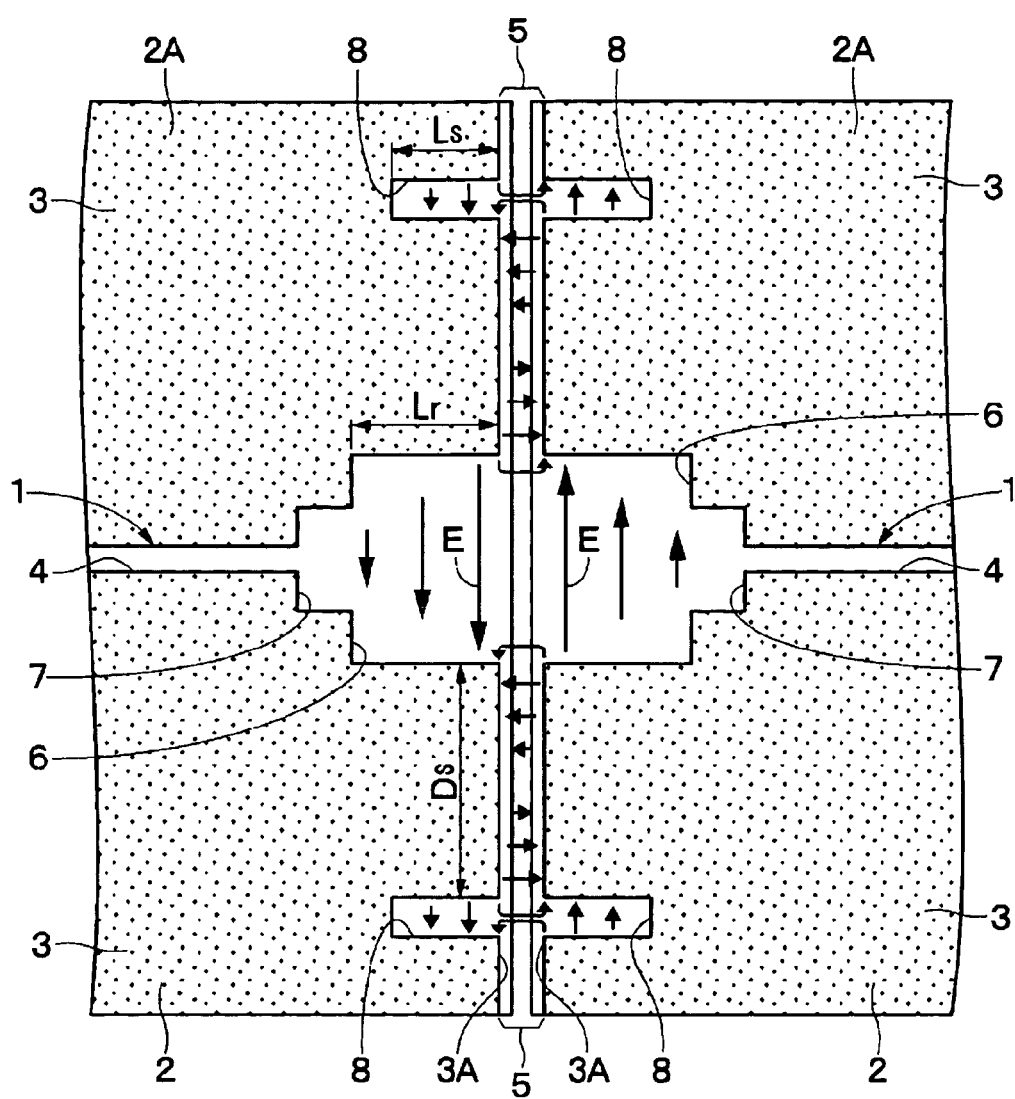
FIG. 10 is a plan view showing a state wherein a slot stub of the transmission line connecting structure according to the first embodiment is positioned farther from the slot resonator as compared to FIG. 9.

On the other hand, when the distance measurement Ds between the slot stub 8 and the slot resonator 6 is set to approximately the same value as ½ of the wavelength $\lambda$g_odd of the high-frequency signal in odd mode (Ds≅$\lambda$g_odd/2), the resonance frequency Fodd in odd mode which is even higher than the resonance frequency Feven in even mode becomes a value closer to the resonance frequency Feven in even mode. At this time, the two slot resonators 6 resonate in a state such as that shown in FIG. 10, and the resonance frequency Fodd is a frequency such that the sum of the length Lr of the slot resonator 6, the distance measurement Ds between the slot stub 8 and the slot resonator 6, and the length Ls of the slot stub 8 is approximately the same as the wavelength $\lambda$g_odd (Lr +Ds+Ls≅$\lambda$g_odd). As a result, the distance measurement Ds can be used as a degree of freedom for determining the resonance frequency Fodd in odd mode.

Also, from the results in FIG. 11, when the distance measurement Ds is varied, the resonance frequency Fodd in odd mode will vary, but it is clear that with the resonance in event mode the high-frequency signal does not leak into the gap 5, and so the resonance frequency F even in even mode hardly varies. Thus, the resonance frequency Fodd in odd mode can be determined independently from the resonance frequency Feven in even mode, and so the design of the connecting structure can be improved.

Thus, with the present embodiment, the slot stub8 is provided on the front surface electrodes 3, and so the high-frequency signal leaked from the gap 5 can be reflected by the band rejection effect of the slot stub 8. Therefore, the leakage of the high-frequency signal transiting the gap 5 can be suppressed, and so actual current does not flow at the end of the gap 5. As a result, depending on the variation in conductive adhesive coating, variation in the package measurements, variation in mounting position of the dielectric substrate 2, and so forth, when mounting the slot lines 1 to the package, even when the end position of the gap 5 has varied, the resonance frequency of the slot resonators 6 is stabilized, and sufficient pass band can be secured between the two slot lines 1.

Also, the mounting position precision of the package and the dielectric substrate 2 of the slot lines 1 or the measurement precision of the package is relaxed, and so the slot lines 1 can be easily attached to the package, the manufacturing cost can be lowered, and freedom of design can be improved.

Further, the length Ls of the slot stub 8 is set to the approximate value of ¼ as to the wavelength $\lambda$g_odd of the high-frequency signal when the slot resonator 6 resonates in odd mode, and so even when the high-frequency signal in odd mode leaks through the gap 5, the branching position (base end side of the slot stub 8) of the gap 5 and the slot stub 8 can be made into a virtual open end as to the high-frequency signal. Thus, the reflective properties as to the leaked high-frequency signal improves, and so the leaked high-frequency signal can be blocked at the slot stub 8 in a sure manner, and the stability of the resonance frequency of the slot resonator 6 can be further heightened. As a result, even when there are comparatively great inconsistencies in the various measurements of the dielectric substrate 2 and so forth, a desired pass bandwidth can be secured between the two slot lines 1, and also connection loss of the two slot lines 1 can be reduced.

Also, with the present embodiment, the distance measurement Ds between the slot stub 8 and the slot resonator 6 is set to a value sufficiently smaller than ½ as to the wavelength $\lambda$g_odd of the high-frequency signal in odd mode (Ds<<$\lambda$g_odd/2), or to a value generally the same as ½ (Ds≅$\lambda$g_odd/2). Thus, according to the value of the distance measurement Ds, the resonance frequency Fodd in odd mode of either a low or a high odd mode can be moved closer to the resonance frequency Feven in even mode. Therefore, the BPF pass band by the two slot resonators 6 can be set as a low frequency side or a high-frequency side of the resonance frequency Feven in even mode, and the pass band can be widened using the coupling of the two modes.

Also, by adjusting the distance measurement Ds, a resonance frequency Fodd in odd mode can be determined independently from the resonance frequency Feven in even mode. Thus, the distance measurement Ds can be used as a degree of freedom for determining the resonance frequency Fodd in odd mode, and the design of the connecting structure can be improved.

Further, in the event that the length (distance measurement Ds) of the gap 5 between the slot resonator 6 and the slot stub 8 is set at a value sufficiently smaller than $\lambda$g_odd/2, the slot resonator 6 and the slot stub 8 can be positioned in closer proximity, and the connecting structure of the slot lines 1 can be made smaller.

Figure 12:
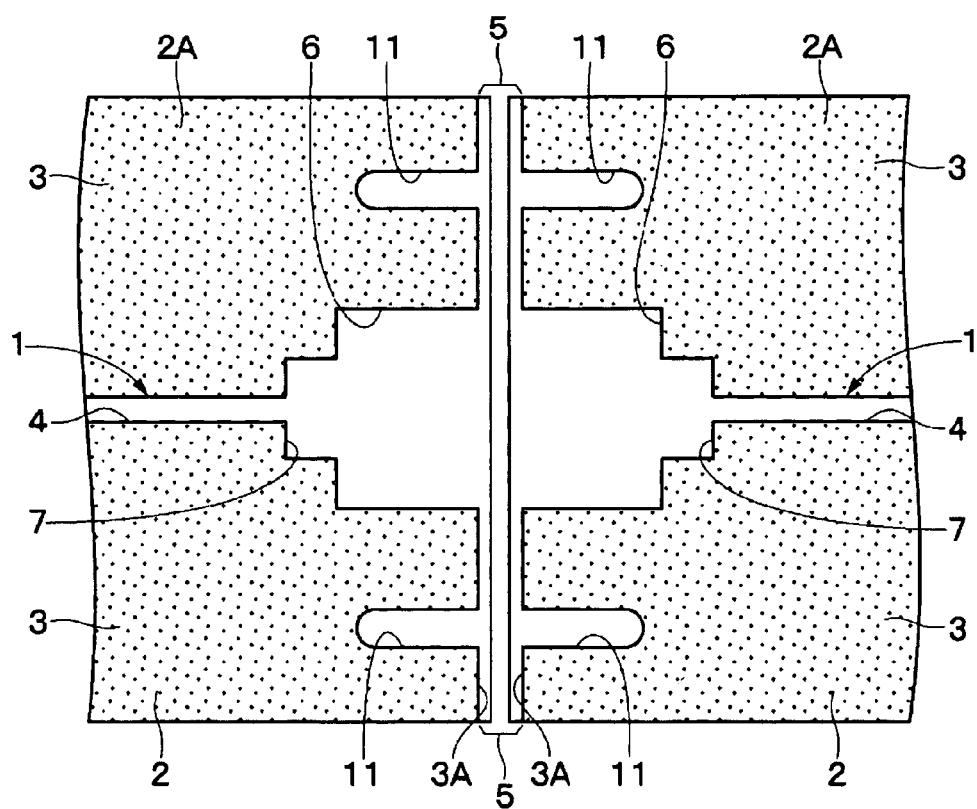
FIG. 12 is an enlarged plan view of a first modified example of a transmission line connecting structure.

The first embodiment has a configuration using a slot stub 8 in an approximately quadrangle band. However, the present invention should not be limited to this, and as in the first modified example in FIG. 12, a slot stub 11 wherein the front end portion is formed in a circular arc can be used. In this event, there are no corners on the front end side of the slot stub 11, and so the current concentration in the corners is relaxed, and loss of the high-frequency signal can be reduced.

Figure 13:
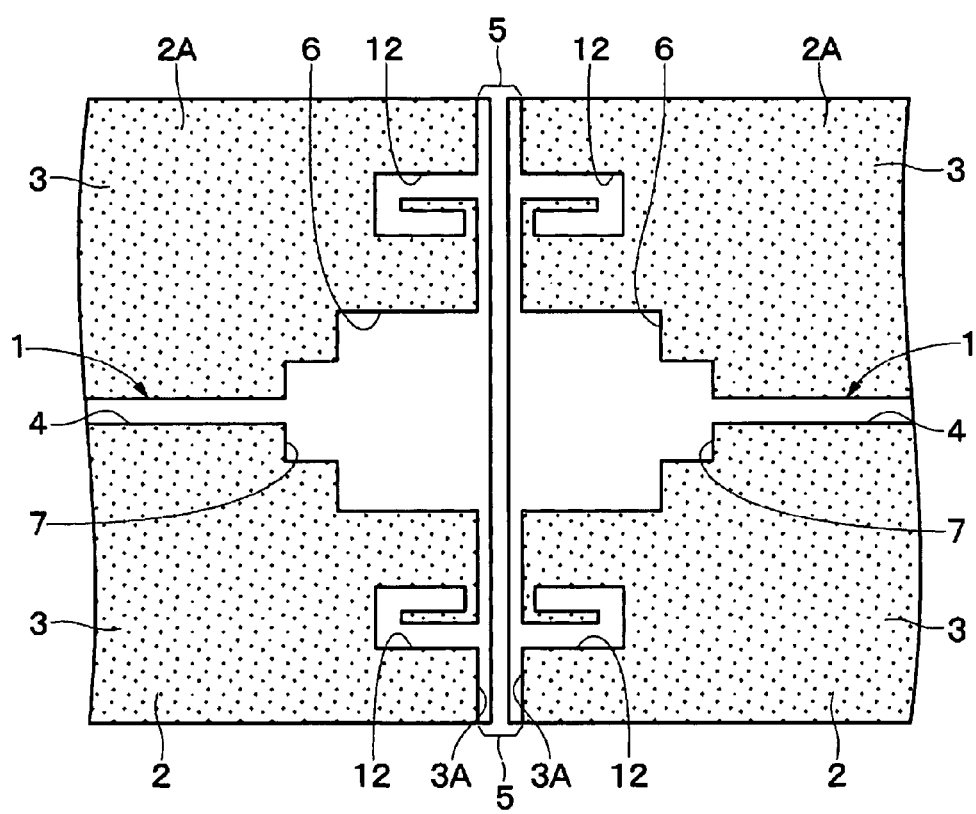
FIG. 13 is an enlarged plan view of a second modified example of a transmission line connecting structure.

Also, the first embodiment has a configuration using a slot stub 8 extending linearly. However, the present invention should not be limited to this, and as in the second modified example in FIG. 13, a slot stub 12 which is folded back at a midpoint can be used. With this, the slot stub 12 can be made smaller.

Figure 14:
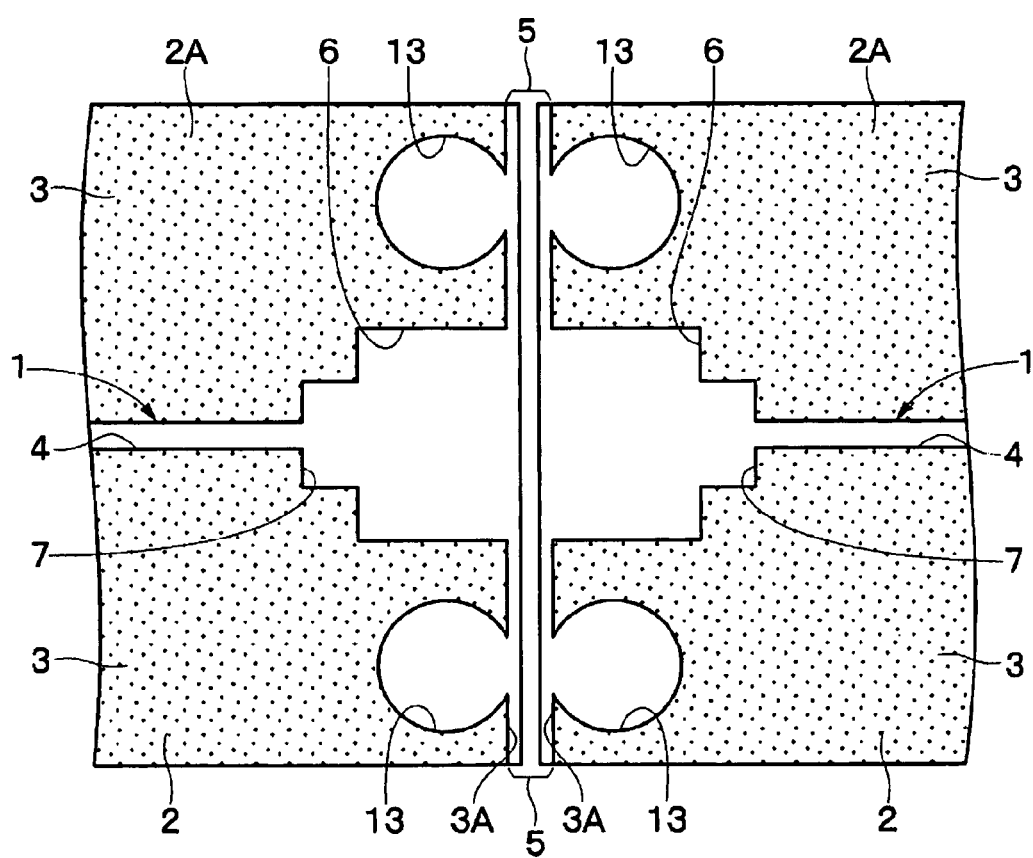
FIG. 14 is an enlarged plan view of a third modified example of a transmission line connecting structure.
Figure 15:
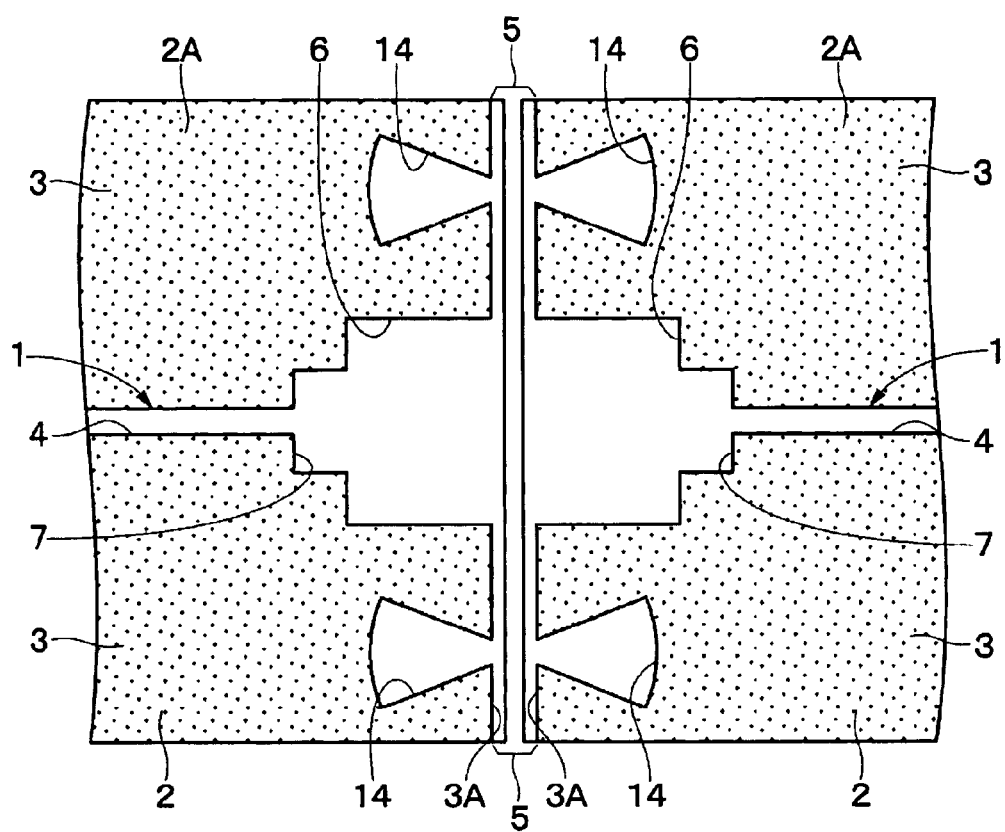
FIG. 15 is an enlarged plan view of a fourth modified example of a transmission line connecting structure.

Also, the first embodiment has a configuration using a slot stub 8 in a band. However, the present invention should not be limited to this, and as in the third modified example in FIG. 14, a slot stub 13 which is an approximate circular shape can be used, or as in the fourth modified example in FIG. 15, a slot stub 14 which is an approximate fan shape can be used. In these cases, loss of the high-frequency signal can be reduced, and leakage of the high-frequency signal can be suppressed over a wide band range.

Figure 16:
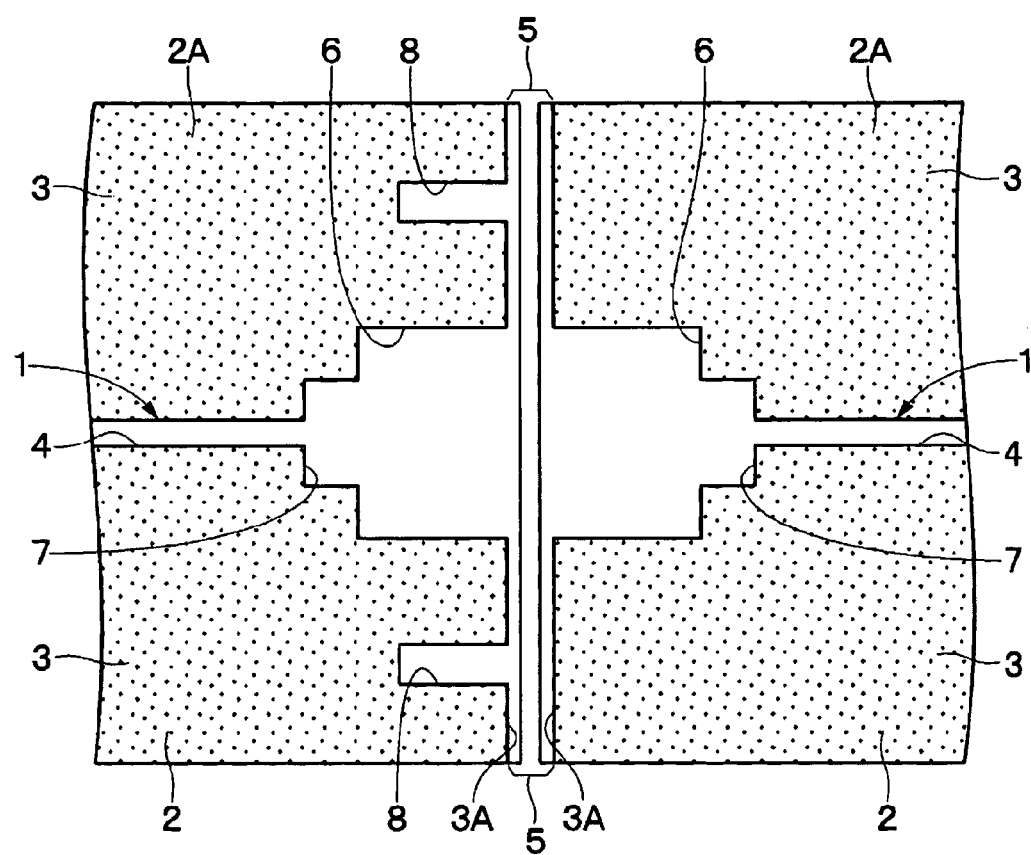
FIG. 16 is an enlarged plan view of a fifth modified example of a transmission line connecting structure.

Further, the first embodiment has a configuration wherein the slot stub 8 is provided on both sides of the two front surface electrodes 3 provided apart from one another, in the width direction with the slot resonator 6 provided therebetween. However, the present invention should not be limited to this, and as in the fifth modified example in FIG. 16, slot stubs 8 can be provided on both sides of one of the front surface electrodes 3 of the two front surface electrodes 3, in the width direction with the slot resonator 6 provided therebetween.

Figure 17:
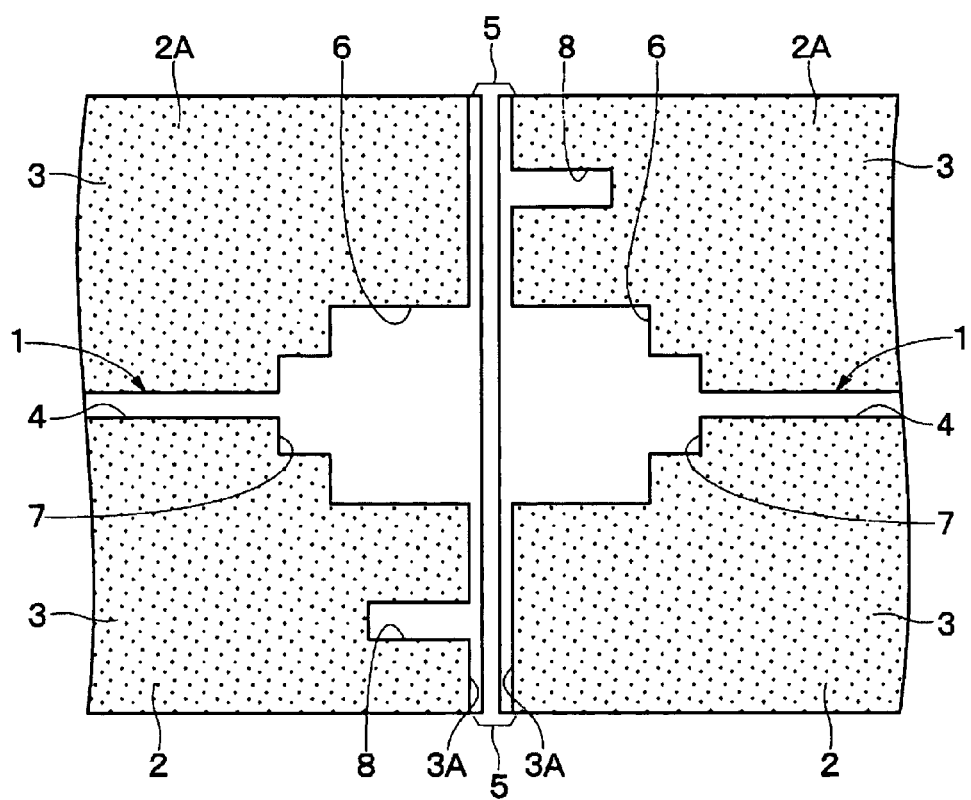
FIG. 17 is an enlarged plan view of a sixth modified example of a transmission line connecting structure.

Also, as in the sixth modified example in FIG. 17, the configuration can be made so that a slot stub 8 is provided on one of the front surface electrodes 3 on one side of the slot resonator 6 in the width direction, and another slot stub 8 is provided on the other front surface electrode 3 on the other side of the slot resonator 6 in the width direction.

Figure 18:
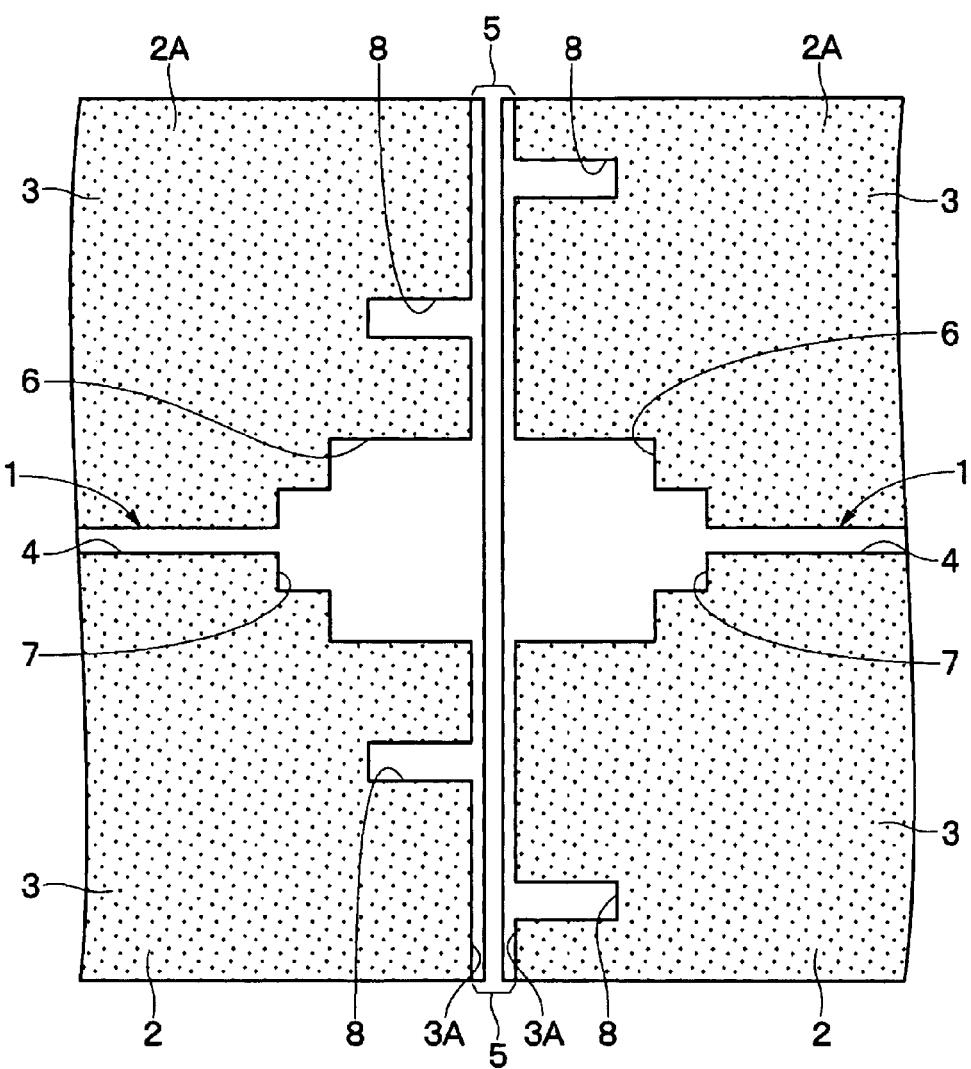
FIG. 18 is an enlarged plan view of a seventh modified example of a transmission line connecting structure.

Further, with the first embodiment, the slot stub 8 provided on one of the front surface electrodes 3 and the slot stub 8 provided on the other front surface electrode 3 are provided in the position which is the same as the distance measurement Ds between the slot stub 8 and the slot resonator 6. However, the present invention should not be limited to this, and as in the seventh modified example in FIG. 18, the slot stub 8 provided on one of the front surface electrodes 3 and the slot stub 8 provided on the other front surface electrode 3 can be provided in a position different from the distance measurement between the slot stub 8 and the slot resonator 6. Thus, leakage of the high-frequency signal can be suppressed over a wide band range.

Also, with the first embodiment, a front surface electrode 3 is provided on only the front surface 2A of the dielectric substrate 2 and the slot line 1 is configured. However, the present invention should not be limited to this, and for example a ground electrode can be provided on the almost entire back surface 2B of the dielectric substrate 2, and a grounded slot line can be configured.

Figure 19:
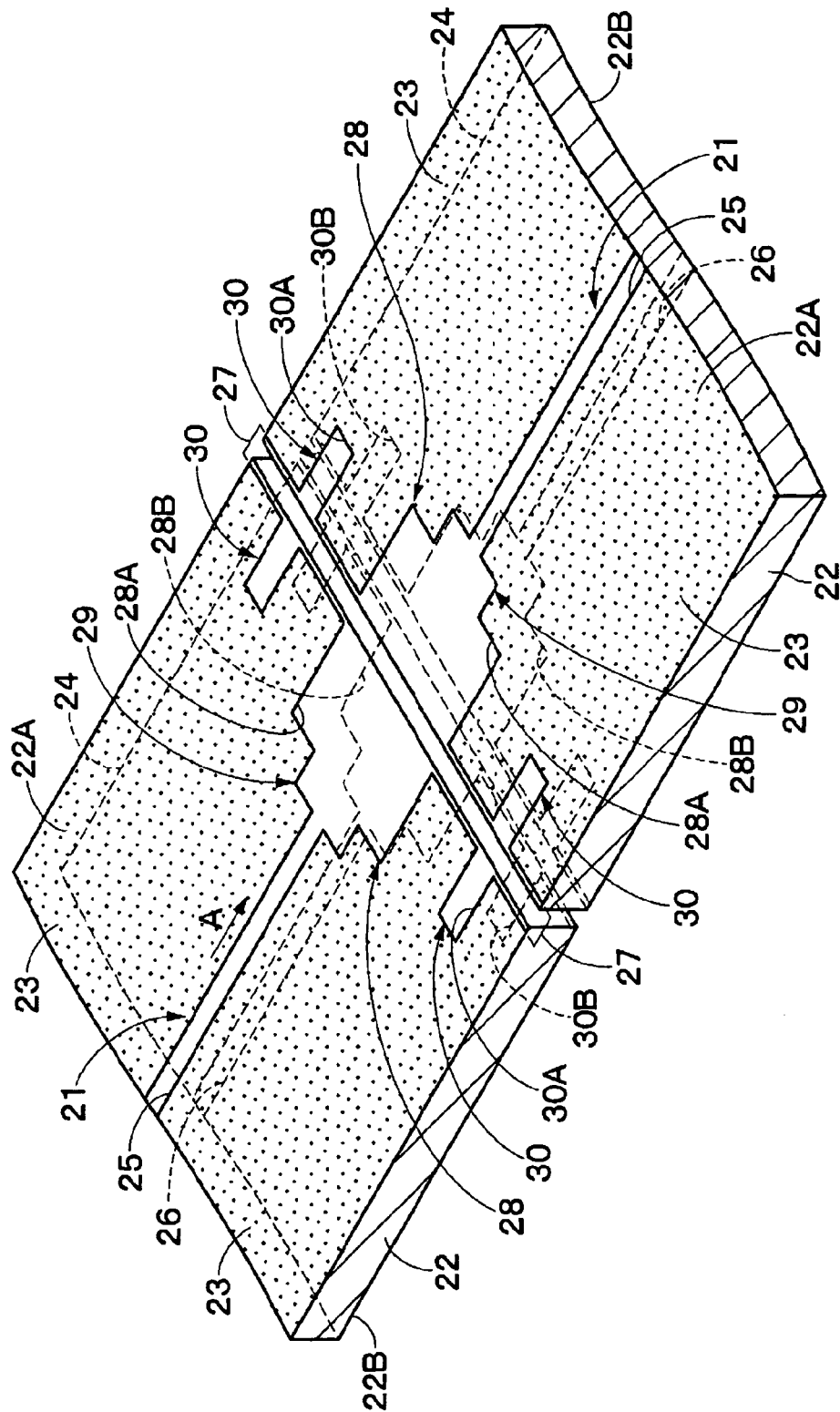
FIG. 19 is a perspective view of a transmission line connecting structure according to a second embodiment.
Figure 20:
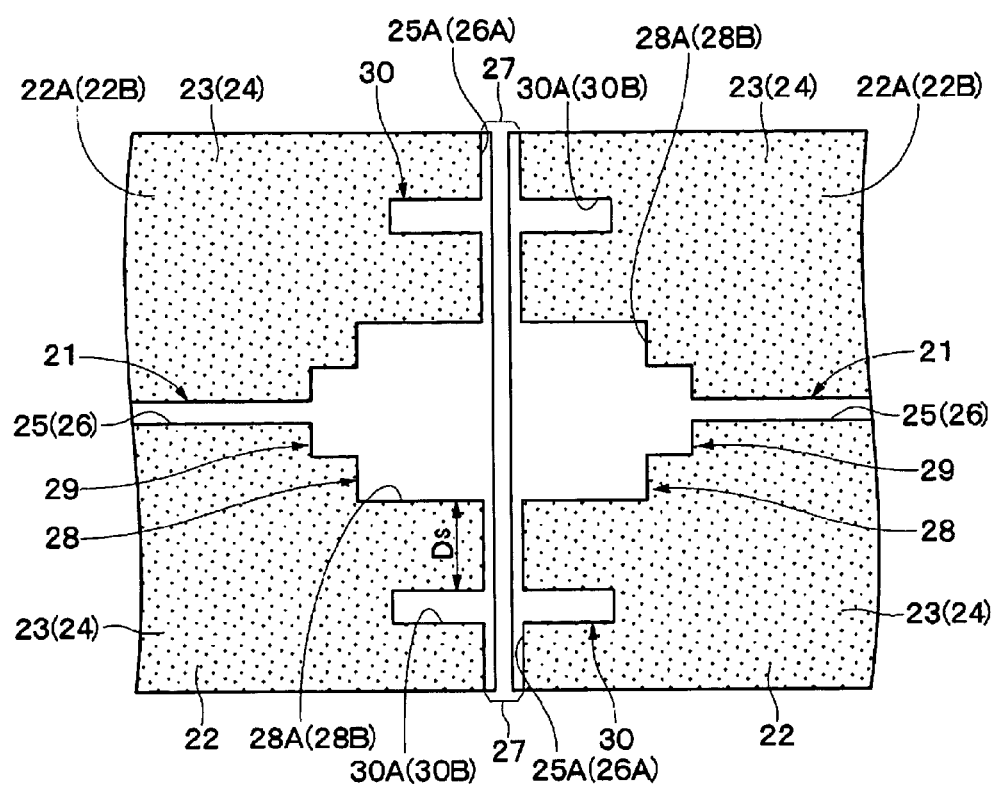
FIG. 20 is an enlarged plan view of the transmission line connecting structure in FIG. 19.

FIG. 19 and FIG. 20 illustrate a transmission line connecting structure according to a second embodiment of the present invention, and a feature of the present embodiment is that the transmission line connecting structure comprises a slot pattern, resonator pattern, and stub pattern, which are the same on both sides of the dielectric substrate, which are positioned opposing one other, and a planar dielectric transmission line (PDTL), a PDTL resonator, and a PDTL stub.

21 denotes a planar dielectric transmission line (hereafter called PDTL 21) formed of a double-sided slot line which is a transmission line. The PDTL 21 comprises a dielectric substrate 22, a front surface electrode 23, a back surface electrode 24, and slots 25 and 26.

The dielectric substrate 22 is formed in a planar shape with a relative permittivity of $\in r$, using a ceramic material or the like, as with the dielectric substrate 2 according to the first embodiment, and has a front surface 22A and a back surface 22B. Also, on the front surface 22A of the dielectric substrate 22, a front surface electrode 23 is provided which is formed as a thin film using an electroconductive metallic material, and on the back surface 22B of the dielectric substrate 22, a back surface electrode 24 is provided which is formed as a thin conductive film. Further, on the front surface electrode 23, a slot 25 is formed which is open in a band form (groove) with a fixed width measurement, and on the back surface electrode 24, a slot 26 is formed in the position which opposes the slot 25 with the dielectric substrate 22 provided therebetween. The slots 25 and 26 are formed generally symmetrically on both sides 22A and 22B of the dielectric substrate 22, and extend along the transmission direction of the high-frequency signal such as a microwave or millimeter wave (the arrow A direction in FIG. 19) for example.

Also, there are two PDTLs 21 positioned linearly for example along the transmission direction of the high-frequency signal. At this time, the dielectric substrates 22 of the two PDTLs 21 are positioned separated from one another. Also, in a position where the two PDTLs 21 are facing each another, the edges 23A and 24A of the electrodes 23 and 24 are positioned farther to the central side (inner side) than the edge face of the dielectric substrate 22 for example. Thus, the portions protruding towards the other dielectric substrate 22 beyond the edges 23A and 24A of the electrodes 23 and 24 of the dielectric substrate 22 have the front surface 22A of the dielectric substrate 22 exposed.

27 denotes a gap formed between the electrodes 23 and 24 (double-sided electrodes) which make up the PDTL 21 on one side and the electrodes 23 and 24 which make up the PDTL 21 on the other side. The gap 27 is formed with a fixed spacing measurement between the edges 23A and 24A of the electrodes 23 and 24 on one side, and the edges 23A and 24A of the electrodes 23 and 24 on the other side, and are opposing one another in a state where the electrodes 23 and 24 on one side and the electrodes 23 and 24 on the other side are separated. Thus, the gap 27 has the electrodes 23 and 24 on one side and the electrodes 23 and 24 on the other side provided therebetween.

28 denotes a PDTL resonator with one end open which is provided on the electrodes 23 and 24 of each PDTL 21. Each PDTL resonator 28 is made of a generally square notch 28A consecutively formed on the front surface electrode 23 in the slot 25, and a generally square notch 28B formed consecutively on the back surface electrode 24 in the slot 26. Also, these square notch 28A and 28B are opposing one another with the dielectric substrate 22 provided therebetween, and are formed generally symmetrically on the two sides 22A and 22B of the dielectric substrate 22. Also, in the PDTL resonator 28, the length along the transmission direction of the high-frequency signal is set to an approximate value of $\lambda g\_even/4$, when the wavelength of the high-frequency signal in even mode which propagates the PDTL 21, for example.

Also, one end side in the length direction of the PDTL resonator 28 is positioned on the edge portion side of the electrodes 23 and 24 (near the edges 23A and 24A) and is open towards the gap 27. On the other hand, the other end side in the length direction of the PDTL resonator 28 is extended toward the central side of the electrodes 23 and 24, and also the PDTL 21 is connected to the central portion in the width direction thereof. Also, the two PDTL resonators 28 oppose one another with the gap 27 provided therebetween, and also are positioned in close proximity so as to allow direct electromagnetic coupling of both.

Also, in between the PDTL resonator 28 and the PDTL 21 is provided a matching section 29 such that the slot width expands in a stair-step manner. The matching section 29 improves the impedance matching between the PDTL resonator 28 and the PDTL 21, and optimizes the amount of coupling therebetween.

30 denotes a PTDL stub formed on the electrodes 23 and 24. The PDTL stub 30 is formed with slot stubs 30A and 30B which extend from the gap 27 toward the central portion side of the electrodes 23 and 24. The slot stubs 30A and 30B are positioned opposing one another with the dielectric substrate 22 provided therebetween, and forms a band of an approximate quadrangle branched out from the gap 27. Also, the PDTL stub 30 is provided on each of the electrodes 23 and 24 on both sides in the transmission direction with the gap 27 provided therebetween, and also are provided on both sides in the extension direction of the gap 27 with the PDTL resonator 28 provided therebetween. Thus, there are two PDTL stubs 30 on each electrode 23 and 24, for a total of four. Also, the length of the PDTL stub 30 is set to for example an approximate value of $\lambda g\_odd/4$ when the wavelength of the high-frequency signal in odd mode which propagates the PDTL 21 is $\lambda g\_odd$. Thus, the PDTL stub 30 can have a midpoint portion of the gap 27 positioned on the base end side as a virtual open end as to the high-frequency signal in odd mode.

Also, with the PDTL stub 30, as with the slot stub 8 according to the first embodiment, the distance measurement Ds between the slot stub 30 and the PDTL resonators 28 is set to a value sufficiently smaller than ½ ($Ds<<\lambda g\_odd/2$) or generally the same value as ½ ($Ds \cong \lambda g\_odd/2$), as to the wavelength $\lambda g\_odd$ of the high-frequency signal in odd mode. In other words, the length of the gap 27 positioned between the PDTL stub 30 and the PDTL resonator 28 (distance measurement Ds) is appropriately set by spreading the pass frequency band of the two-stage BPF formed from the two PDTL resonators 28 in the lower side of the resonating frequency in the even mode, or in the higher side thereof.

The present embodiment also yields similar effects as with the first embodiment.

The present embodiment has a configuration using the PDTL stub 30 wherein the front end portion is extended linearly in a approximate quadrangle shape, as with the slot stub 8 in the first embodiment. However, the present invention should not be limited to this, and as in the first modified example, the front end portion can be formed in a circular arc, or as in the second modified example, the front end portion can be folded back at a midpoint, and as with the third and fourth modified examples, a circular shape or a fan shape can be used. Also, the positioning of the PDTL stub 30 is not limited to the present embodiment, and various placements can be used, as with the fifth through seventh modified examples.

Figure 21:
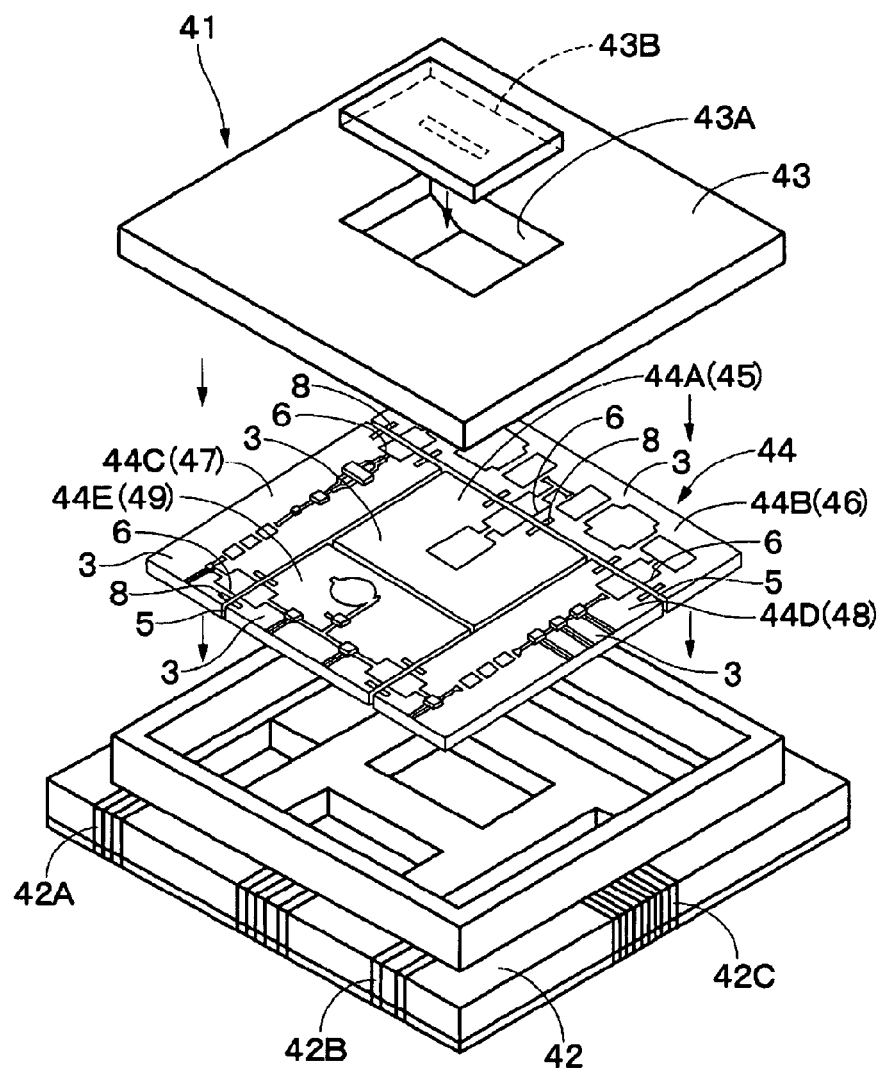
FIG. 21 is a disassembled perspective view showing a communication device according to a third embodiment.
Figure 22:
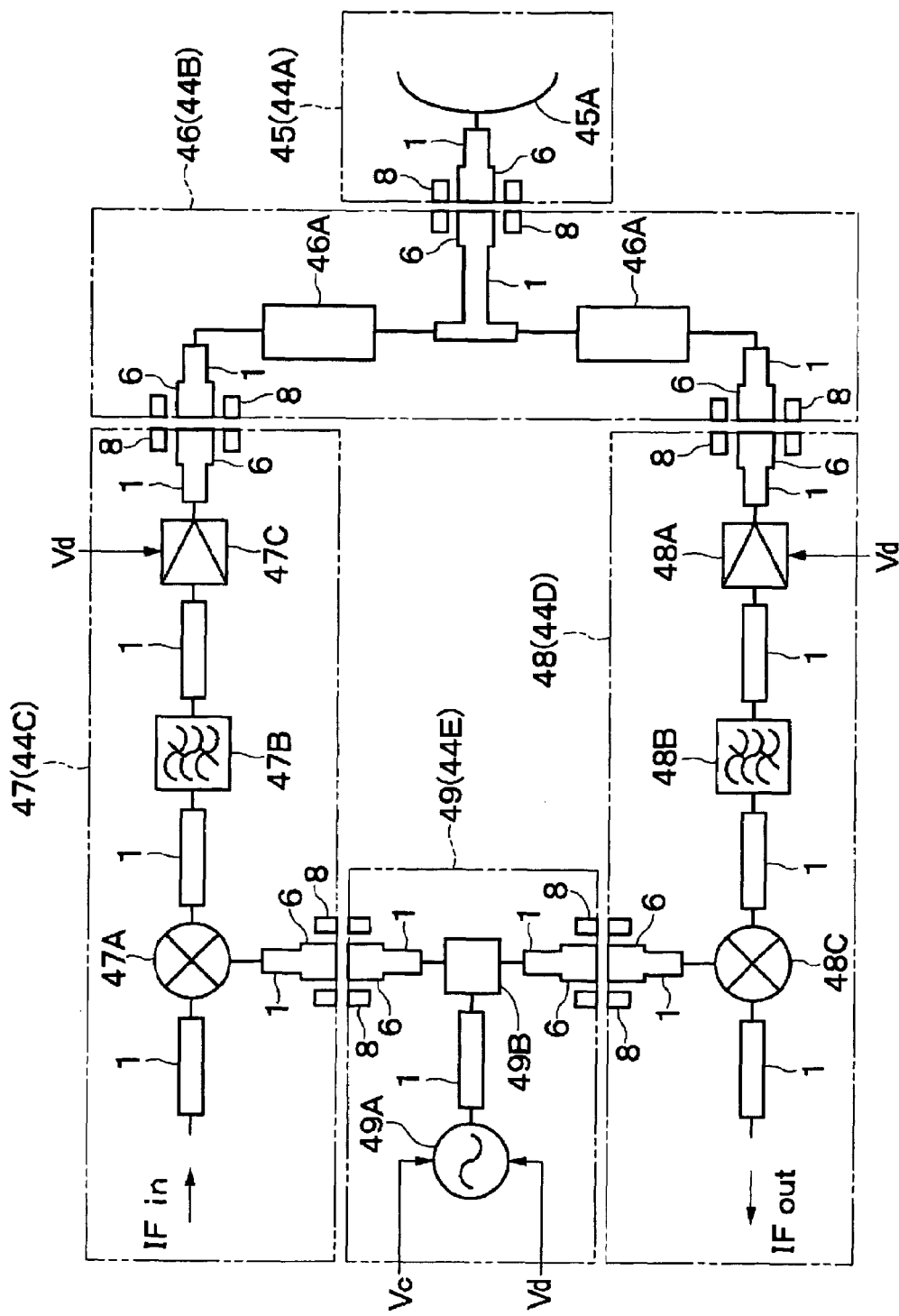
FIG. 22 is a block diagram of the communication device in FIG. 21.

FIG. 21 and FIG. 22 illustrate the third embodiment according to the present invention, and a feature of the present embodiment is that the connecting structure of the slot line according to the present invention is applied to a communication device. With the present embodiment, the same reference numerals for the same components in the first embodiment are used, and thus description thereof will be omitted here.

41 denotes a resin package wherein plating processing (metallization) of an electroconductive metallic material is performed, which forms the exterior of a communication device. The resin package 41 comprises a casing 42 in a box shape wherein the upper face side is open, and a lid 43 which forms an approximate planar quadrangle which covers the open side of the casing 42. On the outer side of the casing 42, an input terminal 42A and an outputting terminal 42B for inputting and outputting an intermediate frequency signal IF are provided, and also an electrode 42C is provided for inputting a bias voltage Vd. On the other hand, an open portion 43A which is open in a tapered manner is formed on the central portion of the lid 43 so that transmitting and receiving electromagnetic waves is possible between the interior and exterior of the casing 42, and also a non-feeding antenna 43B is provided within the open portion 43A. Also, the non-feeding antenna 43B faces a radiation slot 45A of a later-described antenna block 45, and adjusts the directivity and radiation properties (radiation pattern) of the radiation slot 45A.

44 denotes a multi-chip substrate which forms a dielectric substrate housed within the casing 42. The multi-chip substrate 44 comprises, for example, five divided substrates 44A through 44E which are formed of dielectric materials, and as a whole is shaped as an approximate planar quadrangle. Also, a front surface electrode 3 is formed on the almost entire front surface of each of the divided substrates 44A through 44E, and also the front surface electrodes 3 on each of the divided substrates 44A through 44E are separated by the gap 5. Also, on each of the divided substrates 44A through 44E are provided an antenna block 45, a duplexer block 46, a transmitting block 47, a receiving block 48, and a oscillating block 49, as a functioning block, to be described later.

45 denotes the antenna block for transmitting transmission waves and for receiving the receiving waves. The antenna block 45 is provided on the divided substrate 44A which is positioned on the central side of the multi-chip substrate 44. Also, the antenna block 45 comprises an radiation slot 45A, and the radiation slot 45A is connected to the duplexer block 46 by the slot line 1 and the slot resonator 6.

46 denotes a duplexer block which makes up an antenna duplexer which is connected to the antenna block 45. The duplexer block 46 is provided on the divided substrate 44B which is adjacent to the divided substrate 44A on the rear side, and comprises a slot resonator 46A and the like formed of a quadrangle shaped open portion. Also, the slot resonator 46A is connected to each of the antenna block 45, transmitting block 47, and receiving block 48 by the slot line 1 and the slot resonator 6.

47 denotes a transmitting block which is connected to the duplexer block 46, and is for outputting a transmitting signal towards the antenna block 45. The transmitting block 47 is provided on the divided substrate 44C which is adjacent to the divided substrate 44B. Also, the transmitting block 47 comprises a mixer 47A formed using electronic parts such as a field-effect transistor, and which mixes an intermediate frequency signal IF with a local oscillating signal output from the oscillating block 49 to up-convert this to a transmitting signal, a bandpass filter 47B which removes noise signals from the transmitting signal from the mixer 47A, and a power amplifier 47C formed using the electronic parts which operate with the bias voltage Vd, which amplifies the power of the transmitting signal.

The mixer 47A, bandpass filter 47B, and power amplifier 47C are connected to each other using the slot line 1. On the other hand, the mixer 47A is connected to the oscillating block 49 with the slot line 1 and slot resonator 6. Also, the power amplifies 47C is connected to the duplexer block 46 with the slot line 1 and slot resonator 6.

48 denotes a receiving block which is connected to the duplexer block 46 and mixes the receiving signal when a receiving signal is received by the antenna block 45, and the local oscillating signal output from the oscillating block 49, and down-converts this received signal to an intermediate frequency signal IF. This receiving block 48 is provided on the divided substrate 44D which is adjacent to the divided substrate 44B. Also, the receiving block 48 comprises a low-noise amplifier 48A which is formed using electronic part operated by the bias voltage Vd and amplifies the receiving signal at low noise, a bandpass filter 48B which removes noise signals from the receiving signal from the low-noise amplifier 48A, and a mixer 48C which mixes the local oscillating signal output from the oscillating block 49 and the receiving signal output from the bandpass filter 48B and down-converts this to an intermediate frequency signal IF.

The low-noise amplifier 48A, bandpass filter 48B, and mixer 48C are connected with each other with a slot line 1. On the other hand, the low-noise amplifier 48A is connected to the duplexer block 46 with the slot line 1 and the slot resonator 6. Also, the mixer 48C is connected to the oscillating block 49 with the slot line 1 and the slot resonator 6.

49 denotes an oscillating block which is connected to the transmitting block 47 and the receiving block 48, and oscillates a local oscillating signal at a predetermined frequency (a high-frequency signal such as a microwave or millimeter wave, for example). The oscillating block 49 is provided on the divided substrate 44E, which is sandwiched between the divided substrates 44C and 44D. The oscillating block 49 is formed using electronic parts and the like which operate with the bias voltage Vd. Specifically, the oscillating block 49 comprises a voltage control oscillator 49A which oscillates the signal of a frequency according to a control signal Vc, and a branch circuit 49B for supplying the signal from the voltage control oscillator 49A to the transmitting block 47 and the receiving block 48.

The voltage control oscillator 49A and branch circuit 49B are mutually connected with the slot line 1. Also, the branch circuit 49B is connected to the transmitting block 47 and the receiving block 48 with the slot lines 1 and the slot resonators 6.

The slot resonators 6 are provided in close proximity to the two adjacent divided substrates 44A through 44E, and by electromagnetically coupling both, the slot lines 1 between the adjacent divided substrates 44A through 44E are connected.

Also, a slot stub 8 is provided on both sides in the width direction of the slot resonators 6 which connect between the divided substrates 44A through 44E. This suppresses leakage of the high-frequency signal through the gaps 5 between the front surface electrodes 3 to the resin package 41 side.

The communication device according to the present embodiment is configured as described above, and the operation thereof will be described next.

When transmitting is performed using the communication device, a local oscillating signal at a predetermined frequency is input into the transmitting block 47, using the oscillating block 49, and also an intermediate frequency signal IF is input. Thus, the transmitting block 47 mixes the local oscillating signal from the oscillating block 49 and the intermediate frequency signal IF and up-converts this, and this up-converted transmitting signal is output toward the antenna block 45 via the duplexer block 46. As a result, the antenna block 45 radiates a high-frequency transmitting signal through the radiation slot 45A, and the non-feeding antenna 43B adjusts the radiation pattern of the transmitting signal and transmits toward the exterior through the open portion 43A of the lid 43.

On the other hand, when receiving is performed using the communication device, the receiving signal received from the antenna block 45 is input into the receiving block 48 via the duplexer block 46. At this time, a local oscillating signal at a predetermined frequency is input into the receiving block 48, using the oscillating block 49. Thus, the receiving block 48 mixes the local oscillating signal from the oscillating block 49 and the received signal, and down-converts this into an intermediate frequency signal IF.

Thus, according to the present embodiment, the slots lines 1 of the divided substrates 44A through 44E are electrically connected using the slot resonators 6 in a state of non-contact, and also the slot stubs 8 are provided on the periphery of the slot resonators 6. Thus, propagation of the high-frequency signal leaked within the gaps 5 can be suppressed. Therefore, the connection status of the slot lines 1 can be stabilized, and so the properties of the communication device overall can be stabilized, and reliability can be improved. Further, regardless of the measurement precision or mounting precision of the resin package 41, multi-chip substrate 44, front surface electrode 3 and the like, the coupling properties of the slot lines 1 can be stabilized, and so the manufacturing cost of the communication device overall can be lowered and freedom of design can be improved.

With the third embodiment, an example is described wherein a transmission line connecting structure according to the present invention is applicable to a communication device which is a transmission/reception device. However, the present invention should not be limited to this, and can be applied to a transmission/reception device such as a radar device or the like for example.

Also, with the third embodiment, slot lines 1, slot resonators 6, and slot stubs 8 are used. However, the present invention should not be limited to this, and the configuration can use PDTL, PDTL resonators, and PDTL stubs, as with the second embodiment.

Also, with each of the above embodiments, matching sections 7 and 29 are provided between the slot lines 1 and the slot resonators 6, and PDTLs 21 and the PDTL resonators 28. However, the present invention should not be limited to this, and for example the matching sections can be omitted and the slot lines and PDTLs can be directly connected to the slot resonators and PDTL resonators.

Also, with each of the above embodiments, the edges 3A, 23A, and 24A of the front surface electrodes 3 and 23 and the back surface electrode 24 are positioned in a position different from the edge faces of the dielectric substrates 2 and 22. However, the present invention should not be limited to this, and for example the end of the front surface electrodes and back surface electrodes can be positioned in the same position as the edge face of the dielectric substrate.

Further, with each of the above embodiments, the two slot lines 1 and PDTLs 21 are provided separate from the two dielectric substrates 2 and 22. However, the present invention should not be limited to this, and for example two slot lines can be provided by providing two front surface electrodes separately on one dielectric substrate, or two PDTLs can be provided on one dielectric substrate.

The invention claimed is:

1. A transmission line connecting structure comprising: a plurality of connected transmission lines, each of the transmission lines including a dielectric substrate, an electrode formed on a first side of the dielectric substrate, and a first slot having a predetermined width and formed in the electrode; wherein the electrode of a first transmission line of the plurality of connected transmission lines and the electrode of a second transmission line of the plurality of connected transmission lines are positioned at a distance from one another to form a gap therebetween; wherein a respective resonator is connected to each of the plurality of connected transmission lines so as to be able to couple with one another, one end of each respective resonator being open on a side thereof facing the gap; wherein at least one stub for suppressing leakage of a first signal in the gap is provided in at least one of the electrodes of the plurality of connected transmission lines; and wherein, when the wavelength of a second signal in odd mode which propagates the plurality of connected transmission lines is $\lambda g\_odd$, a length of the stub is approximately $\lambda g\_odd/4$, and a length between the respective resonator and the stub is smaller than $\lambda g\_odd/2$.

2. The transmission line connecting structure according to claim 1, further comprising:
   a second electrode formed on a second side of the dielectric substrate opposite the first side;
   a second slot formed in the second electrode, the second slot having a predetermined width and opposing the first slot; and
   a second resonator connected to the second electrode, one end of the second resonator being open on a side thereof facing the gap.

3. A transmission/reception device comprising a transmission line connecting structure according to claim 1.

4. The transmission line connecting structure according to claim 1, wherein an end portion of the at least one stub is in a circular arc shape.

5. The transmission line connecting structure according to claim 1, wherein the at least one stub is folded back at a midpoint thereof.

6. The transmission line connecting structure according to claim 1, wherein the at least one stub is circular in shape.

7. The transmission line connecting structure according to claim 1, wherein the at least one stub has a fan shape.

8. A transmission line connecting structure comprising: a plurality of connected transmission lines, each of the transmission line including a dielectric substrate, an electrode formed on a first side of the dielectric substrate, and a first slot having a predetermined width and formed in the electrode, wherein the electrode of a first transmission line of the plurality of connected transmission lines and the electrode of a second transmission line of the plurality of connected transmission lines are positioned at a distance from one another to form a gap therebetween; wherein a respective resonator is connected to each of the plurality of connected transmission lines so as to be able to couple with one another, one end of each respective resonator being open on a side thereof facing the gap; wherein at least one stub for suppressing leakage of a first signal in the gap is provided in at least one of the electrodes of the plurality of connected transmission lines; and wherein when the wavelength of a second signal in odd mode which propagates the plurality of connected transmission lines is $\lambda g\_odd$, a length of the stub is approximately $\lambda g\_odd/4$, and a length between the respective resonator and the stub is approximately $\lambda g\_odd/2$.

9. The transmission line connecting structure according to claim 8, further comprising:
- a second electrode formed on a second side of the dielectric substrate opposite the first side;
- a second slot formed in the second electrode, the second slot having a predetermined width and opposing the first slot; and
- a second resonator connected to the second electrode, one end of the second resonator being open on a side thereof facing the gap.

10. The transmission line connecting structure according to claim 8, wherein an end portion of the at least one stub is in a circular arc shape.

11. The transmission line connecting structure according to claim 8, wherein the at least one stub is folded back at a midpoint thereof.

12. The transmission line connecting structure according to claim 8, wherein the at least one stub is circular in shape.

13. The transmission line connecting structure according to claim 8, wherein the at least one stub has a fan shape.

14. A transmission line connecting structure comprising:
a transmission line including:
- a dielectric substrate;
- an electrode formed on at least one side of the dielectric substrate;
- a slot having a predetermined width formed in the electrode;
- a resonator provided in the electrode, one end of the resonator being open; and
- a stub for suppressing leakage of a signal in the transmission line.

15. The transmission line connecting structure according to claim 14, wherein, when a wavelength of a signal in an odd mode which propagates the transmission line is $\lambda g\_odd$, a length of the stub is approximately $\lambda g\_odd/4$, and a length between the resonator and the stub is smaller than $\lambda g\_odd/2$.

16. The transmission line connecting structure according to claim 14, wherein, when the wavelength of a signal in an odd mode which propagates the transmission line is $\lambda g\_odd$, a length of the stub is approximately $\lambda g\_odd/4$, and a length between the resonator and the stub is approximately $\lambda g\_odd/2$.

17. The transmission line connecting structure according to claim 14, wherein an end portion of the at least one stub is in a circular arc shape.

18. The transmission line connecting structure according to claim 14, wherein the at least one stub is folded back at a midpoint thereof.

19. The transmission line connecting structure according to claim 14, wherein the at least one stub is circular in shape.

20. The transmission line connecting structure according to claim 14, wherein the at least one stub has a fan shape.

* * * * *